(12) United States Patent
Saito et al.

(10) Patent No.: US 8,983,421 B2
(45) Date of Patent: Mar. 17, 2015

(54) SEMICONDUCTOR DEVICE AND OPERATING METHOD THEREOF

(75) Inventors: Toshihiko Saito, Atsugi (JP); Kiyoshi Kato, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 522 days.

(21) Appl. No.: 13/024,549

(22) Filed: Feb. 10, 2011

(65) Prior Publication Data

US 2011/0128801 A1 Jun. 2, 2011

Related U.S. Application Data

(63) Continuation of application No. 11/593,528, filed on Nov. 7, 2006, now Pat. No. 7,912,439.

(30) Foreign Application Priority Data

Nov. 25, 2005 (JP) ................................. 2005-341191

(51) Int. Cl.
*H04B 1/06* (2006.01)
*G06K 19/077* (2006.01)
(Continued)

(52) U.S. Cl.
CPC ........... *G06K 19/07749* (2013.01); *B82Y 10/00* (2013.01); *G11C 13/0014* (2013.01); *G11C 13/004* (2013.01); *G11C 13/0069* (2013.01);
(Continued)

(58) Field of Classification Search
CPC ..... G06F 11/002; H01L 27/0218; H02H 3/20
USPC ................................................. 455/333, 41.2
See application file for complete search history.

(56) References Cited

U.S. PATENT DOCUMENTS 4,990,760 A 2/1991 Tomari et al.
5,340,968 A 8/1994 Watanabe et al.
(Continued)

FOREIGN PATENT DOCUMENTS

CN 001630083 A 6/2005
CN 001684198 10/2005
(Continued)

OTHER PUBLICATIONS

Korean Office Action (Application No. 2006-0117031) Dated Nov. 7, 2012.
(Continued)

*Primary Examiner* — Wesley Kim
*Assistant Examiner* — Richard Chan
(74) *Attorney, Agent, or Firm* — Eric J. Robinson; Robinson Intellectual Property Law Office, P.C.

(57) ABSTRACT

In an organic memory which is included in a radio chip formed from a thin film, data are written to the organic memory by a signal inputted with a wired connection, and the data is read with a signal by radio transmission. A bit line and a word line which form the organic memory are each selected by a signal which specifies an address generated based on the signal inputted with a wired connection. A voltage is applied to a selected memory element. Thus writing is performed. Reading is performed by a clock signal or the like which are generated from a radio signal.

15 Claims, 16 Drawing Sheets

(51) Int. Cl.
  *B82Y 10/00* (2011.01)
  *G11C 13/00* (2006.01)
  *H01L 27/12* (2006.01)
  *H01L 51/05* (2006.01)

(52) U.S. Cl.
  CPC ............ *H01L 27/12* (2013.01); *H01L 27/1214* (2013.01); *H01L 51/0591* (2013.01); *G11C 2213/79* (2013.01)
  USPC ...... 455/352; 455/130; 455/353; 365/189.11; 365/226

(56) References Cited

U.S. PATENT DOCUMENTS

| | | | |
|---|---|---|---|
| 5,532,692 | A | 7/1996 | Tatsuya |
| 5,557,096 | A | 9/1996 | Watanabe et al. |
| 5,926,110 | A | 7/1999 | Downs et al. |
| 6,686,263 | B1 | 2/2004 | Lopatin et al. |
| 6,842,395 | B2 | 1/2005 | Kawai et al. |
| 6,848,620 | B2 | 2/2005 | Nakane et al. |
| 7,099,222 | B2 | 8/2006 | Takahashi et al. |
| 7,494,066 | B2 | 2/2009 | Koyama et al. |
| 7,508,946 | B2 | 3/2009 | Yamagata et al. |
| 7,641,820 | B2 | 1/2010 | Chen et al. |
| 7,795,617 | B2 | 9/2010 | Koyama et al. |
| 7,942,338 | B2 | 5/2011 | Koyama et al. |
| 8,027,648 | B2 * | 9/2011 | Brady et al. .................... 455/83 |
| 8,313,035 | B2 | 11/2012 | Koyama et al. |
| 2002/0153997 | A1 | 10/2002 | Nakane et al. |
| 2003/0080797 | A1 * | 5/2003 | Fujikawa ...................... 327/333 |
| 2003/0081445 | A1 * | 5/2003 | Van Brocklin et al. ....... 365/100 |
| 2005/0128807 | A1 | 6/2005 | Chen et al. |

FOREIGN PATENT DOCUMENTS

| | | |
|---|---|---|
| EP | 0341712 A | 11/1989 |
| EP | 0512543 A | 11/1992 |
| EP | 0587115 A | 3/1994 |
| EP | 1 403 761 | 3/2004 |
| JP | 01-286046 A | 11/1989 |
| JP | 03-208111 A | 9/1991 |
| JP | 05-139530 A | 6/1993 |
| JP | 2000-011129 | 1/2000 |
| JP | 2003-016418 | 1/2003 |
| JP | 2003-223623 A | 8/2003 |
| WO | 2006/043573 | 4/2006 |
| WO | 2006/043611 | 4/2006 |
| WO | 2006/057417 | 6/2006 |
| WO | 2006/059554 | 6/2006 |
| WO | 2006/080478 | 8/2006 |

OTHER PUBLICATIONS

Chinese Office Action (Application No. 201110200853.6) Dated Aug. 26, 2013.

Chinese Office Action (Application No. 201110200853.6) Dated May 13, 2014.

* cited by examiner

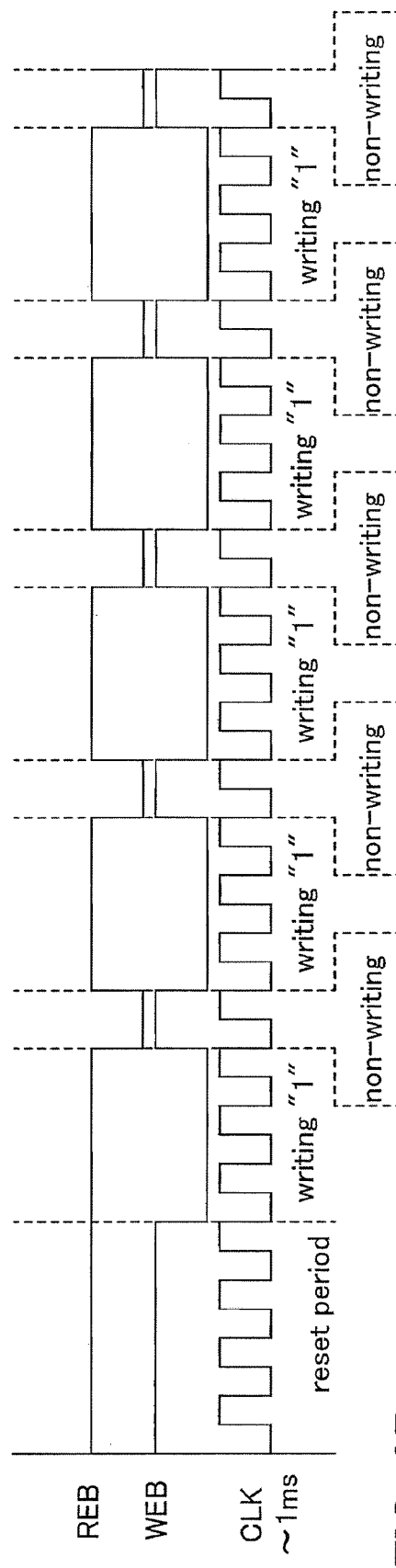
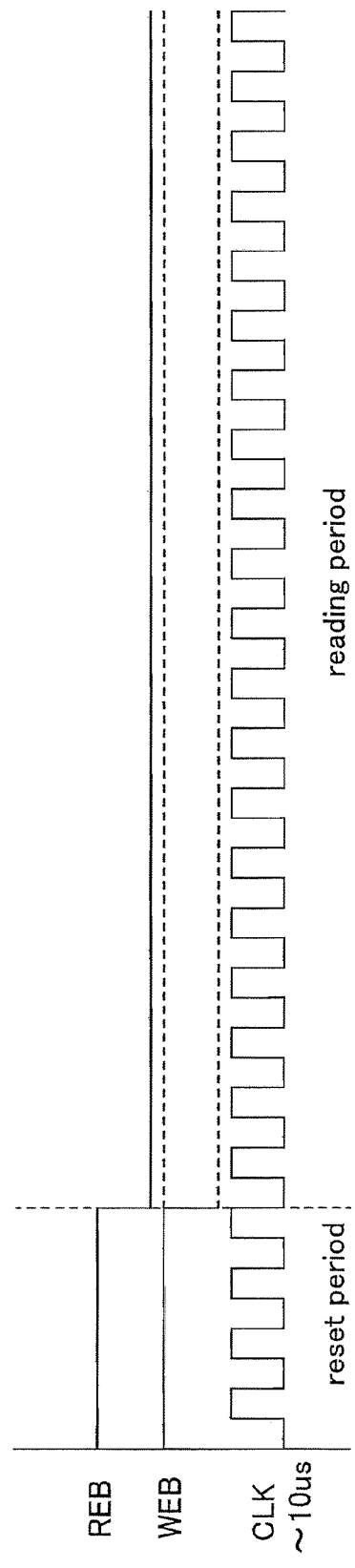

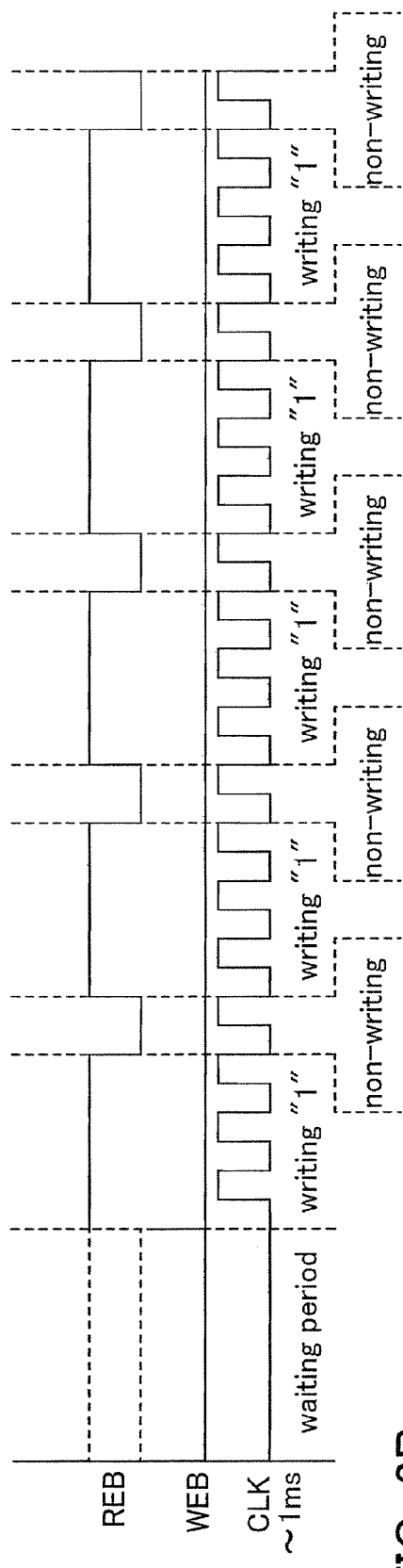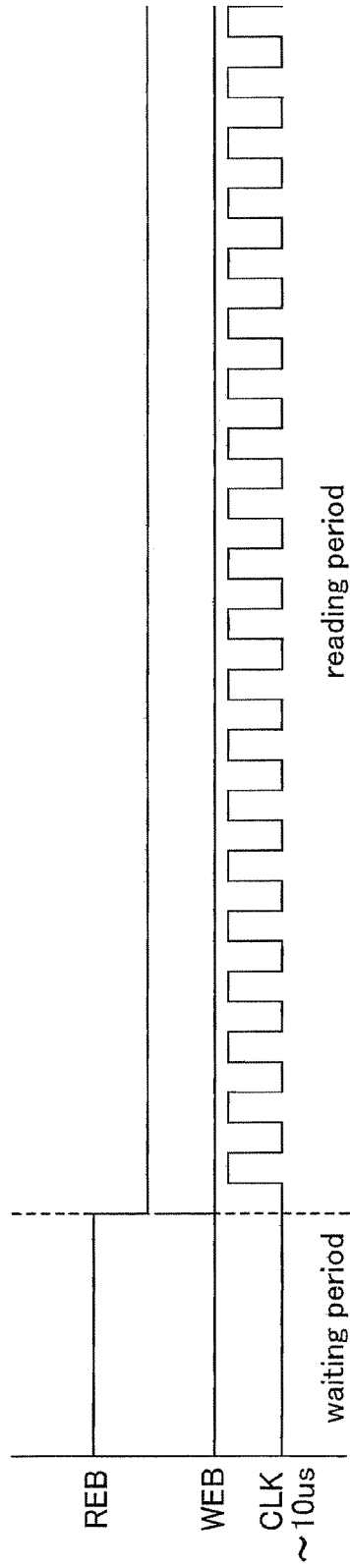

650

SEMICONDUCTOR DEVICE AND OPERATING METHOD THEREOF

BACKGROUND OF THE INVENTION

1. Field of the Invention

The present invention relates to a semiconductor device which includes a memory region having an organic compound layer, and an operating method thereof.

2. Description of the Related Art

A semiconductor device including a radio communication function, specifically a radio chip is expected to have a large market. Such a radio chip is referred to as an ID tag, an IC tag, an IC chip, an RF (Radio Frequency) tag, a radio tag, an electronic tag, and an RFID (Radio Frequency Identification) in accordance with usage.

A radio chip includes an interface, a memory, a control section, and the like. As a memory, a random access memory (hereinafter referred to as RAM), which can be written and read, and a read only memory (hereinafter referred to as ROM), which is read only, are employed and used properly in accordance with usage. Specifically, a memory region is assigned to each particular application, and an access right is managed separately in each application and each directory. In order to manage an access right, a radio chip includes a collating unit which compares with a private code of an application, and a control unit which gives a user the access right to the application when the private code is matched as a result of comparison by the collating unit (refer to Patent Document 1).

Such a radio chip is formed from a silicon wafer, and an integrated circuit such as a memory circuit and an arithmetic circuit is formed over a circuit side of a semiconductor substrate (refer to Patent Document 2).

When a card (so-called IC card) with such a radio chip is compared with a magnetic card, the IC card has advantages of having a large memory capacity, an arithmetic function, high authentication accuracy, and great difficulty in falsification. Therefore, a local government or the like has adopted the IC card, which is preferably used for personal information management.

[Patent Document 1]
   Japanese Published Patent Application No. 2003-16418
[Patent Document 2]
   Japanese Published Patent Application No. 2000-11129

SUMMARY OF THE INVENTION

A radio chip is manufactured by using an expensive silicon wafer similarly to a microprocessor and a semiconductor memory. Accordingly, it has been naturally limiting to reduce the unit cost of a chip. Especially, a large area of a chip is occupied by a memory region which is necessary for a radio chip; therefore, it is required to reduce an occupied area of a memory region without changing memory capacity in order to reduce the unit cost of a chip.

In addition, in a conventional radio chip, silicon is used as a structure even if a chip is miniaturized. Therefore, in the case where a conventional radio chip is used as an IC tag, it is not appropriate to be attached to a substrate of a commercial product having a curved surface shape. A method of thinning a chip by grinding and polishing a silicon wafer itself may be applied; however, the number of steps is increased, which is contradictory to cost reduction. Even if a chip is thinned, in the case of using as an IC tag or the like attached to a commercial product, when a radio chip is attached to a thin slip of paper, it is feared that the beauty is spoiled because a protrusion occurs on surface of a commercial product and that the existence of a chip, which is an object of falsification, is emphasized.

Further, under a conventional technology, identification information is required to be stored in ROM in a radio chip in order that an individual radio chip is identified; therefore, the number of steps for wire connection is increased and productivity is decreased.

In view of the foregoing circumstances, one of the objects of the present invention is to thin and miniaturize a semiconductor device including a radio communication function and to reduce costs.

In view of the above problems, the present invention operates an organic memory included in a radio chip which is formed of a thin film based on a signal by radio transmission. A bit line and a word line which fowl the organic memory are each selected by a signal which specifies an address (hereinafter referred to as an address signal) which is generated based on a signal by radio transmission. A voltage is applied to a selected part of a memory element. Thus writing is performed. Reading is performed by a generated clock signal or the like.

Note that an organic memory is provided with a plurality of memory elements, and the memory element includes an organic compound layer which is sandwiched between a pair of electrodes. Each pair of the electrodes included in the memory element is provided with a switching element and the radio chip of the invention includes a so-called active type organic memory. An organic compound layer is a layer containing an organic material and may have a structure where layers with different functions are stacked or a single layer structure.

Such a memory and a circuit which forms a radio chip or the like can be formed over one substrate. Therefore, a radio chip can be provided with a memory without increasing a manufacturing step and manufacturing cost.

Specific examples of the invention are described below.

One mode of the invention is an operating method of a semiconductor device including a memory region having an organic memory; and a wire to which a reading signal is inputted, a wire to which a writing signal is inputted, and a wire to which a clock signal is inputted, which are connected to the organic memory. The reading signal is inputted from a radio signal input portion. The writing signal is inputted from an external signal input portion. In a reset period, the reading signal and the writing signal are set to be high signals (hereinafter referred to as HIGH). Note that a high signal is generally referred to as HIGH, a HIGH level, an H level, or the like.

Another mode of the invention is an operating method of a semiconductor device including a memory region having an organic memory; and a wire to which a reading signal is inputted, a wire to which a writing signal is inputted, and a wire to which a clock signal is inputted, which are connected to the organic memory. The reading signal is inputted from a radio signal input portion. The writing signal is inputted from an external signal input portion. In a writing period, a reading signal is set to be HIGH and a writing signal is set to be a low signal (hereinafter referred to as LOW), and data is written to the organic memory. Note that a low signal is generally referred to as LOW, a LOW level, an L level, or the like.

Another mode of the invention is an operating method of a semiconductor device including a memory region having an organic memory; and a wire to which a reading signal is inputted, a wire to which a writing signal is inputted, and a wire to which a clock signal is inputted, which are connected to the organic memory. Data is read from the organic memory regardless of a state of a writing signal when a reading signal is LOW.

In the invention, a reset period is a period for resetting generation of an address signal.

Another mode of the invention is an operating method of a semiconductor device including a radio signal input portion (hereinafter referred to as an RF (Radio Frequency) input portion); a memory region having an organic memory; and a wire to which a reading signal is inputted, a wire to which a writing signal is inputted, a wire to which a clock signal is inputted, and a diode, which are connected to the organic memory. Data is written to the organic memory while an external signal is interrupted by the diode. The data of the organic memory is read while a writing power supply potential of the organic memory is fixed at a high potential side power supply potential of two kinds of power supply potentials supplied from the RF input portion.

Another mode of the invention is an operating method of a semiconductor device including an RF input portion; a memory region having an organic memory; and a wire to which a reading signal is inputted, a wire to which a writing signal is inputted, a wire to which a clock signal is inputted, and a resistor, which are connected to the organic memory. Data is written into the organic memory while an external signal is interrupted by the resistor. The data of the organic memory is read while a writing power supply potential of the organic memory is fixed at a high potential side power supply potential supplied from the RF input portion.

In the invention, a resistor is included in a pull-up circuit.

Another mode of the invention is a semiconductor device including an RF input portion, a logic circuit portion, an external signal input portion, and a memory region having an organic memory. The RF input portion has a function of rectifying a radio wave received from an antenna in order to generate a power supply potential and a function of frequency-dividing the radio wave received from the antenna in order to generate a clock signal. The memory region includes an adjustment circuit portion which has a diode. A high potential side power supply potential terminal which is included in a logic circuit portion and a writing power supply potential (also referred to as VDDH) terminal which is included in the memory region are connected through the diode.

Another mode of the invention is a semiconductor device including an RF input portion, a logic circuit portion, an external signal input portion, and a memory region having an organic memory. The RF input portion has a function of rectifying a radio wave received from an antenna in order to generate a power supply potential and a function of frequency-dividing the radio wave received from the antenna in order to generate a clock signal. The memory region includes an adjustment circuit portion which has a plurality of resistors. A clock signal terminal which is included in the logic circuit portion and the logic circuit portion are connected through any one of the resistors.

Another mode of the invention is a semiconductor device including an RF input portion, a logic circuit portion, an external signal input portion, and a memory region having an organic memory. The RF input portion has a function of rectifying a radio wave received from an antenna in order to generate a power supply potential and a function of frequency-dividing the radio wave received from the antenna in order to generate a clock signal. The memory region includes an adjustment circuit portion which has a plurality of resistors or a diode. A clock signal terminal which is included in the logic circuit portion and the logic circuit portion are connected through any one of the resistors. A high potential side power supply potential terminal which is included in the logic circuit portion and a VDDH terminal which is included in the memory region are connected through the diode.

Another mode of the invention is a semiconductor device including an RF input portion, a logic circuit portion, an external signal input portion, and a memory region having an organic memory. The RF input portion has a function of rectifying a radio wave received from an antenna in order to generate a power supply potential and a function of frequency-dividing the radio wave received from the antenna in order to generate a clock signal. The logic circuit portion includes a high potential side power supply potential terminal, a low potential side power supply potential terminal, and a clock signal terminal. The external signal input portion includes a signal output pad, a writing signal input pad, a reading signal input pad, a clock signal pad, a ground potential pad, a high potential side power supply potential pad, and a writing power supply potential pad. The organic memory includes an organic compound layer. The memory region includes an adjustment circuit portion which has a plurality of resistors or a diode. The clock signal terminal and the logic circuit portion are connected through any one of the resistors. The high potential side power supply potential terminal and a VDDH terminal which is included in the memory region are connected through the diode.

In the invention, a resistor is included in a pull-up circuit.

In the invention, an organic memory includes a plurality of memory cells. Each of the memory cells includes an organic compound layer and a switching element which is connected to the organic compound layer.

In the invention, a protection circuit is provided between a writing signal input pad, a reading signal input pad, and a clock signal pad, with which an external signal input portion is provided; and a writing signal input terminal, a reading signal input terminal, and a clock signal terminal, with which a memory region is provided.

By an operating method of the invention, an organic memory written by a writing signal which is externally inputted through the pads with wired connection can be read by a signal which is generated by a logic circuit in accordance with a radio wave. In addition, the organic memory is not affected by a signal which is generated by the logic circuit when operating by the external writing signal inputted with wired connection. The organic memory is not affected by an external input when operating by a reading signal which is generated by the logic circuit in accordance with a radio wave.

BRIEF DESCRIPTION OF DRAWINGS

FIGS. 3A and 3B are timing charts of an organic memory included in a radio chip of the invention.
FIGS. 6A and 6B are timing charts of an organic memory included in a radio chip of the invention.

DETAILED DESCRIPTION OF THE INVENTION

Figure 1A:
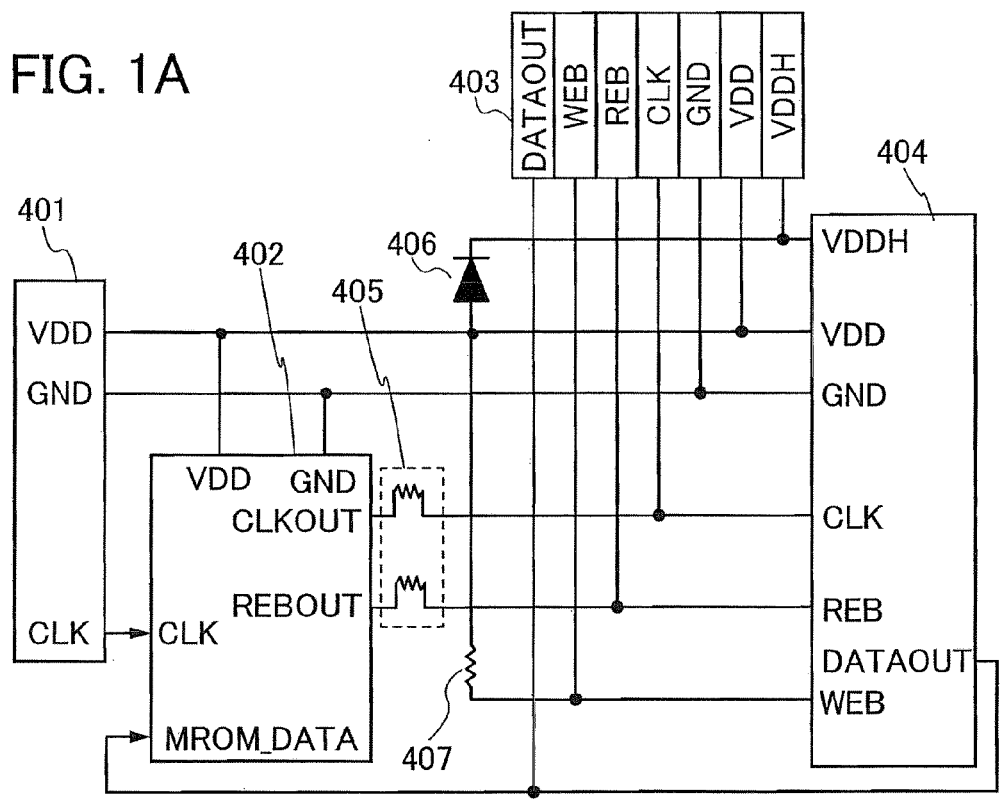
FIGS. 1A and 1B are circuit diagrams of a radio chip of the invention.

Hereinafter, description is made of embodiment modes of the invention with reference to drawings. However, it is to be easily understood by those skilled in the art that the invention can be implemented by many different modes, and modes and details herein disclosed can be modified in various ways without departing from the purpose and the scope of the invention. Therefore, the invention should not be interpreted as being limited to the description of these embodiment modes described below. Note that in the drawings showing the embodiment modes, the same components or components having similar functions are denoted by the same reference numerals and repetitive description thereof is omitted.

Embodiment Mode 1

In this embodiment mode, a structure of a radio chip is described.

As shown in FIG. 1A, a radio chip includes an RF input portion 401, a logic circuit portion 402, an external signal input portion 403, a memory region 404 including an organic memory, and an adjustment circuit portion 405.

Two kinds of power supply potentials which are a high potential side power supply potential (VDD) and a low potential side power supply are applied from the RF input portion. The RF input portion 401 includes a high potential side power supply potential (VDD) terminal and a low potential side power supply potential terminal. Further, the RF input portion 401 includes a clock signal (CLK) terminal. In this embodiment mode, a ground potential (GND) is used as a low potential side power supply potential.

The RF input portion 401 rectifies a radio wave received from an antenna (not shown) in order to generate VDD and frequency-divides a received radio wave in order to generate a CLK. The RF input portion 401 can also include a power supply circuit, a clock generator, a demodulation circuit, and a modulation circuit. The power supply circuit includes a rectifier circuit and a storage capacitor and can generate a power supply voltage. The demodulation circuit includes an LPF (Low Pass Filter) and can extract data from a radio signal. The modulation circuit can superimpose data on a radio signal by the Manchester method.

The logic circuit portion 402 is connected to the high potential side power supply potential (VDD) and the ground potential (GND). The clock signal is inputted to the logic circuit portion 402. The logic circuit portion 402 can also include a controller and a CPU. The controller includes a radio transmission interface, a clock control circuit, a control register, a received data register, a transmitted data register, a CPU interface, or the like. The demodulation circuit and the modulation circuit can exchange a signal with the control register, the received data register, and the transmitted data register through the radio transmission interface. The clock generator is controlled by the clock control circuit. The clock control circuit operates in accordance with the control register. The control register, the received data register, and the transmitted data register can exchange a signal with the CPU through the CPU interface.

The external signal input portion 403 is provided with a plurality of pads, and for example, includes a signal output (DATAOUT) pad, a writing signal (WEB) input pad, a reading signal (REB) input pad, a clock signal (CLK) pad, a ground potential (GND) pad, a high potential side power supply potential (VDD) pad, and a writing power supply potential (VDDH) pad.

The memory region 404 including an organic memory is provided with a VDDH terminal to which a potential through the VDDH pad is inputted, a VDD terminal to which a potential through the VDD pad is inputted, a GND terminal to which a potential through the GND pad is inputted, a CLK terminal to which a signal through the CLK pad is inputted, an REB terminal to which a signal through the REB pad is inputted, and a WEB terminal to which a signal through the WEB pad is inputted. ROM or RAM is also formed in the memory region 404 as a memory element. The ROM or the RAM can exchange data with the control register, a received data register and a transmitted data register through the CPU interface.

The memory region 404 is provided with the adjustment circuit portion 405 for controlling the ROM or the RAM. The adjustment circuit portion 405 includes a plurality of resistors. The CLK terminal of the memory region 404 and the logic circuit portion 402 are connected through any one of the resistors. The REB terminal of the memory region 404 and the logic circuit portion 402 are connected through another one of the resistors. The adjustment circuit portion 405 adjusts an unnecessary control signal by the logic circuit portion 402 in order to prevent the unnecessary control signal from being inputted to the memory region 404 when data is written to or read from the memory region 404 by using an external signal inputted through the external signal input portion 403.

In a structure of the radio chip of the invention, a distance between the memory region 404 and the plurality of pads (hereinafter referred to as a pad region) provided in the external signal input portion 403 is 500 µm or more and 1 mm or less, and preferably 750 µm or more and 1 mm or less. When the pad region and the memory region 404 are provided so as to have a distance approximate to the aforementioned distance, the memory region 404 is not provided below the pad region. As a result, data can be written without being affected by stress from pressure-bonding of an antenna. More preferably, a circuit or the like is not provided below the pad region, thereby not affected by stress from pressure-bonding of the antenna. Note that since a conventional radio chip formed from a silicon wafer has a certain hardness, it can be connected to the antenna even if pressure is put upon a place where an element is formed in a face down state. However, the radio chip of the invention is formed from a thin film; therefore, an element such as a memory might be destroyed by stress from pressure-bonding of the antenna if a conventional structure is applied. In the invention, a memory region or a circuit is not formed below a pad region, thereby a structure where an antenna can be attached by pressure-bonding without destroying the memory region or the circuit is applied.

A resistor 407 is included in a pull-up circuit and functions as an adjustment circuit. The adjustment circuit portion 405 adjusts an unnecessary control signal by the logic circuit portion 402 in order to prevent the unnecessary control signal from being inputted to the memory region 404 when data is written to the memory region 404. Similarly, the resistor 407 adjusts a signal by the logic circuit portion 402 in order to prevent the signal from being inputted to the memory region 404 when data is written to the memory region 404. When data is written to the memory region 404, a potential input to the VDDH pad of the external signal input portion is higher than a potential input to the VDD pad of the external signal input portion, so that the diode 406 becomes an off state. On the other hand, when data is read from the memory region 404, a potential inputted to the VDDH terminal of the memory region 404 is fixed to VDD applied from the RF input portion 401 so as to be stabilized. The diode 406 can be formed of a thin film transistor which is diode-connected. For example, an element that is a diode-connected p-channel thin film transistor can be used.

In addition, the high potential side power supply potential (VDD) terminal of the RF input portion 401 and the VDDH terminal of the memory region 404 are connected through the diode 406. Thus, by connecting them through the diode, a short circuit can be prevented between an external power supply circuit which is connected to the high potential side power supply potential (VDD) pad and an external power supply circuit which is connected to the VDDH pad when writing is performed to the memory region 404.

Such a radio chip is connected to an antenna, and a resonant circuit is constituted by the antenna and a resonant capacitor. A signal and an electric power can be obtained by radio transmission through the antenna.

As a signal transmission method of the aforementioned radio chip, to which contactless data can be inputted or outputted, an electromagnetic coupling method, an electromagnetic induction method, a microwave method, or the like can be used. A transmission method may be appropriately selected by a practitioner in consideration of an intended use. An optimum antenna may be provided in accordance with the transmission method.

A voltage and a signal which are inputted from the external signal input portion 403 are inputted to the memory region 404, and data (information) is written to the memory region 404. The RF input portion 401 receives an alternating current signal by the antenna and inputs a voltage and a signal to the logic circuit portion 402. The signal becomes a control signal through the logic circuit portion 402 and the written data is read from the memory region 404 by the control signal inputted to the memory region 404.

In a structure of the radio chip of the invention, when data is written to the memory region 404, a potential from the VDDH pad of the external signal input portion 403 is interrupted to the VDDH terminal of the memory region 404. On the other hand, when data is read from the memory region 404 by a signal from the antenna, a potential inputted to the VDDH terminal of the memory region 404 is fixed to VDD supplied from the RF input portion 401 by the diode 406, and thereby can be stabilized.

Figure 1B:
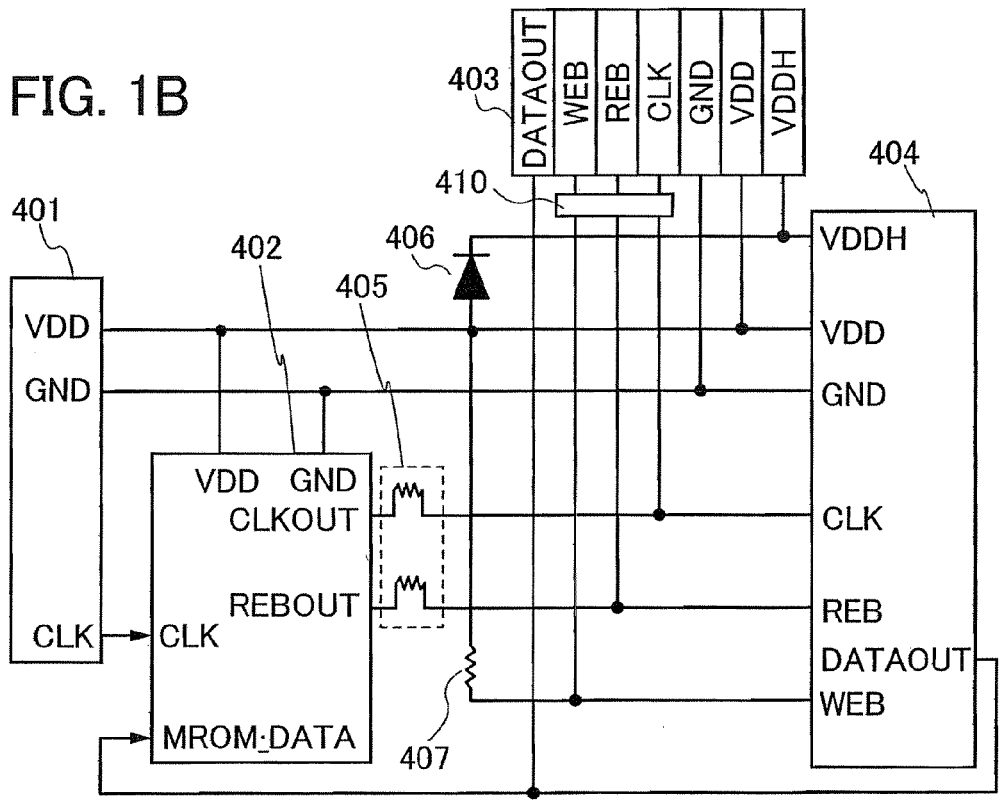

As shown in FIG. 1B, a protection circuit 410 may be provided. The protection circuit 410 is preferably provided near the external signal input portion 403 because static electricity often occurs in the external signal input portion 403. In this embodiment mode, the protection circuit 410 is provided between the WEB pad, the REB pad, and the CLK pad; and the WEB terminal, the REB terminal and the CLK terminal. The protection circuit 410 includes at least one thin film transistor between each pad and each terminal. Note that as a channel length of the thin film transistor is made longer, withstand pressure from static electricity or the like can be improved, which is preferable.

By the circuit and the operating method thereof in this embodiment mode, the organic memory written by a writing signal which is externally inputted through the pads with wired connection can be read by a signal which is generated by a logic circuit in accordance with a radio signal. In addition, when operating by the external writing signal inputted with wired connection, the organic memory is not affected by a signal which is generated by the logic circuit.

Since the radio chip of the invention is formed from a thin film, even when the radio chip of the invention is attached to a thin slip of paper, for example, it can be attached to a surface of the slip of paper with little unevenness and the beauty is not spoiled. Further, since the radio chip of the invention is formed from a thin film, it can be attached to a surface of a commodity with a curved surface shape.

Embodiment Mode 2

In this embodiment mode, description is made of an operation of the organic memory shown in Embodiment Mode 1.

FIG. 3A is a timing chart in the case of writing and shows waveforms of REB, WEB and CLK. At this time, a period of CLK is set to be about 1 ms. A reset period is when REB and WEB are in a HIGH state. Subsequently, when WEB becomes a LOW state, HIGH(1) is written to the organic memory. Next, when REB becomes a LOW state and WEB becomes a HIGH state at the same time, writing is not performed to the organic memory. Writing to the organic memory is performed by repeating these periods successively.

FIG. 3B is a timing chart in the case of reading and shows waveforms of REB, WEB and CLK. At this time, a period of CLK is set to be about 10 μs. A reset period is when REB and WEB are in a HIGH state. Subsequently, REB becomes a LOW state, that is, a reading period starts.

As described above, when both REB and WEB are in a HIGH state, an operation of a circuit stops and an address is reset. That is, when one of REB and WEB is in a LOW state, an address is advanced one by one each time CLK falls.

In addition, when REB is in a HIGH state and WEB is in a LOW state, writing is performed to a memory cell corresponding to an address at that time.

Further, when REB is in a LOW state, data is read from a memory cell corresponding to an address at that time regardless of a state of WEB, and a result is outputted from an output wire of the organic memory.

In a writing period, when writing is not performed to a certain memory cell, a value of REB is changed in order that reading is performed. This is because writing cannot be performed while an address to which writing is not performed is skipped due to a structure of an address signal generation circuit. Note that WEB in the reading period may be in a HIGH state or a LOW state.

Figure 4:
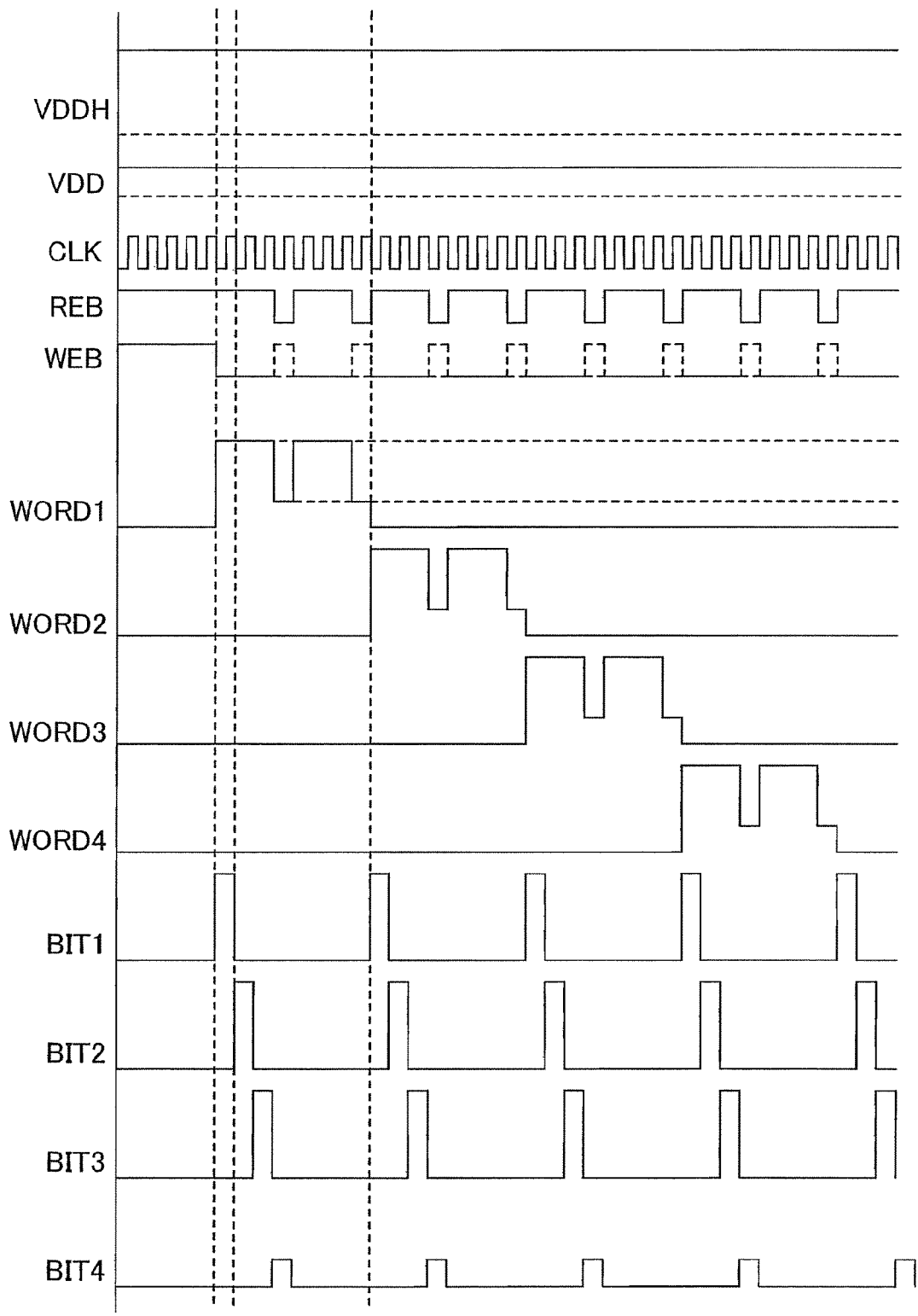
FIG. 4 is a timing chart of an organic memory included in a radio chip of the invention.

Next, description is made of a timing chart of a writing operation by wired connection with reference to FIG. 4. FIG. 4 shows waveforms of VDDH, VDD, CLK, REB, and WEB in this order from the top. A value of each voltage is illustrated by an example that VDDH is 10 V, VDD is 3 V, and CLK is 0 V or 3 V.

Specifically, the external input is performed by inputting VDD, VDDH, GND, CLK, WEB=0, and REB=1 to an external input pin. VDD is used as a power supply potential of a decoder. VDDH is used as a writing power supply potential. CLK is used for generating an address signal.

An address signal is formed from A0 to A5 and respective inverted signals thereof A0B to A5B. As for an initial value thereof, A0=A1=A2=A3=A4=A5=0 and A0B=A1B=A2B=A3B=A4B=A5B=1 are satisfied. The value is changed each time CLK falls. That is, when a group of signals is shown as (A0, A1, A2, A3, A4, A5), the initial value is (0, 0, 0, 0, 0, 0), and each time CLK falls, (1, 0, 0, 0, 0, 0), (0, 1, 0, 0, 0, 0), (1, 1, 0, 0, 0, 0), ... (1, 1, 1, 1, 1, 1), (0, 0, 0, 0, 0, 0) are repeated.

By such address signals A0 to A5 and A0B to A5B, one bit line and one word line are selected in the decoder. Potentials of the bit line and the word line which are selected are raised from VDD to VDDH by a level shifter.

Since each memory cell is an active type that includes a switching element, a TFT within a cell of a row selected by the word line is turned on. In a column selected by the bit line, a writing voltage is applied through the bit line. An organic element is short-circuited when a writing voltage is applied, and thereafter is in a written state.

Note that an order of specifying an address has determined and cannot be changed. Therefore, in the case where an element to which writing is allowed to be performed and an element to which writing is not allowed to be performed are mixed in the memory region, the value of REB is adjusted in order that a reading operation is performed, which prevents writing to the element to which writing is not allowed to be performed.

In addition, as the operating method of the invention, a method in which an address signal is generated individually in a logic circuit and sent to the memory region may be applied. In this case, an address signal is required to be inputted when writing. Further, a method in which an address signal is generated in a predetermined order when reading and an address is directly specified when writing may be applied.

Figure 5:
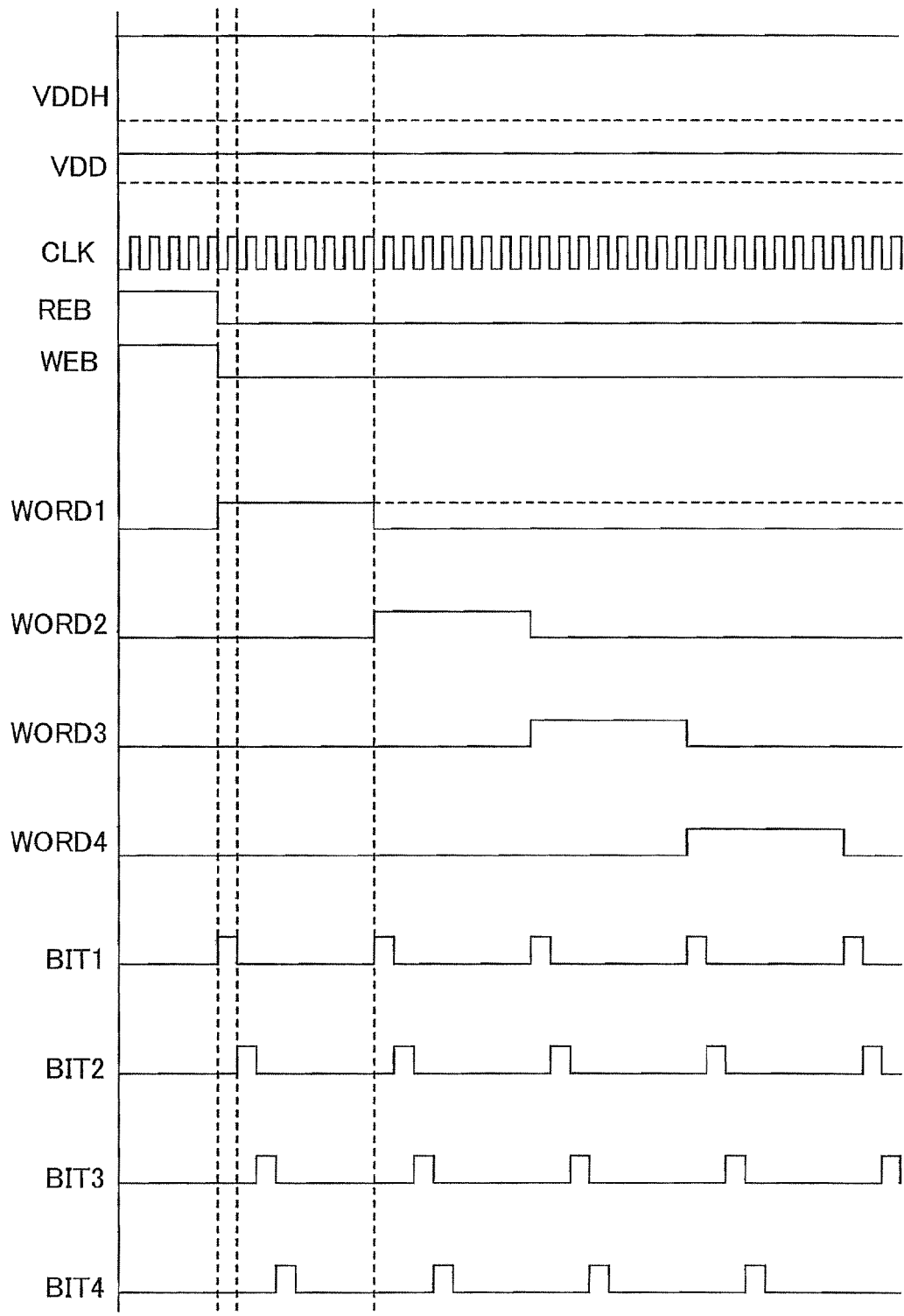
FIG. 5 is a timing chart of an organic memory included in a radio chip of the invention.

Next, description is made of a timing chart of a reading operation by wire connection with reference to FIG. 5. FIG. 5 shows waveforms of VDDH, VDD, CLK, REB, and WEB in this order from the top. A value of each voltage is illustrated by an example that VDDH is 10 V, VDD is 3 V, and CLK is 0 V or 3 V.

Specifically, the external input is performed by inputting VDD, VDDH, GND, CLK, WEB=0, and REB=0 to an external input pin. Note that a method of generating an address signal is the same as in the case of writing. Therefore, a TFT in a memory cell of a row selected by the word line is turned on. Further, a reference voltage is applied to all bit lines through resistors.

A resistor is provided between the reference voltage and the bit line and pulls up a potential of the memory element. That is, a memory cell to which writing has performed is short-circuited. Accordingly, a voltage of the bit line becomes almost 0 due to the ground potential when the memory cell to which writing has performed is selected. A diode-connected thin film transistor is used for such a resistor.

On the other hand, a memory cell to which writing has not performed is insulated. Therefore, the voltage of the bit line becomes almost equal with the reference voltage when the memory cell to which writing has not performed is selected. In accordance with such a voltage of the bit line, read data is outputted.

Note that in the case of a reading operation, although the reference voltage is applied to all bit lines through resistors, a gate is provided in order that data passes only a bit line corresponding to a selected column so as to be outputted; therefore, data of a bit line which is not selected is not mixed.

Here, description is made of reading by a signal from an antenna. When the signal from the antenna is inputted, a clock signal and a reading signal are generated in a logic circuit. Then, reading is performed by the generated signal. Note that a method of generating an address signal and a method of reading data are similar to a method of the abovementioned method of reading by wire connection.

In the case where reading is performed by the signal from the antenna, VDDH is not inputted naturally when an external input by wire connection is not performed. Therefore, VDD is preferably inputted through a diode in order to prevent an input terminal of VDDH of a memory element from being in a floating state.

In addition, FIG. 5 shows waveforms of signals WORD1 to WORD4 inputted to the word lines which form the organic memory and waveforms of signals BIT1 to BIT4 inputted to the bit lines which form the organic memory. A voltage is illustrated by an example that the highest potential of WORD is 10 V and the lowest potential thereof is 0 V. Note that waveforms of WORD5 to WORD8 and BIT5 to BIT8 which are not shown in FIG. 5 are similar to the waveforms of WORD1 to WORD4 and BIT1 to BIT4 respectively, and description thereof is omitted.

Actually, 4 or more word lines and bit lines are often provided. For example, in the case of providing 8 word lines and 8 bit lines similarly to FIG. 4, selection is performed sequentially from BIT1 each time CLK falls. Then, selection is performed sequentially from WORD1 with a cycle of 8 times as long as BIT selection.

Specifically, when REB and WEB become a LOW state, WORD1 becomes a HIGH state in accordance with timing of CLK. At this time, selection is performed sequentially from BIT1. When all BITs are selected, WORD1 becomes a LOW state and WORD2 becomes a HIGH state.

An operation is performed in the cases of WORD3 and WORD4 in a similar manner. As a result, reading can be performed from the organic memory.

Next, FIG. 4 shows waveforms of signals WORD1 to WORD4 which are inputted to the word lines and waveforms of signals BIT1 to BIT4 which are inputted to the bit lines in the case where data such as 11101110 . . . is inputted to organic memory cells arranged in matrix of 8×8. Note that FIG. 4 shows BIT1 to BIT4 which are typical waveforms of BIT1 to BIT8. Waveforms of BIT5 to BIT8 which are not shown in FIG. 4 are omitted because these are a repetition of those of BIT1 to BIT4. Waveforms of WORD5 to WORD8 are omitted because these are similar to those of WORD1 to WORD4. A voltage is illustrated by an example that the highest potential of WORD is 10 V, the lowest potential thereof is 0 V, and the medium potential thereof is 3 V.

For example, in the case of providing 8 word lines and 8 bit lines, selection is performed sequentially from BIT1 each time CLK falls. Then, selection is performed sequentially from WORD1 with a cycle of 8 times as long as BIT selection. By repeating this sequentially, writing can be performed to the organic memory.

Specifically, in FIG. 4, when WEB becomes a LOW state and the reset period is finished, BIT1 and WORD1 become a HIGH state, which continues until CLK falls. When CLK falls, BIT2 becomes a HIGH state. This continues sequentially until BIT8 becomes a HIGH state. When CLK falls while BIT8 is in a HIGH state, WORD1 becomes a LOW state and WORD2 and BIT1 become a HIGH state. WORD3, WORD4 . . . , follow in a similar manner, and WORD1 starts again after WORD8 rises. In this manner, access to the memory cells arranged in matrix is performed. This operation continues until WEB and REB become a HIGH state and reset is performed. The highest potential is applied to BIT lines and WORD lines as a potential of a HIGH state when writing, and the medium potential is applied to BIT lines and WORD lines as a potential of a HIGH state when reading. Hereinafter, a state where the highest potential is applied is called a first HIGH state, and a state where the medium potential is applied is called a second HIGH state. In this case, data is inputted as 11101110 . . . , so that the BIT lines and the WORD lines become the first HIGH state in a selection period of BIT1, BIT2 and BIT3 to which data1 is inputted. Further, reading is performed in a selection period of BIT4 to which data0 is inputted, so that REB becomes LOW and the BIT lines and the WORD lines become the second HIGH state. At this time, in cells of a selected row, potentials of all BIT lines other than the BIT lines to which writing is performed become the second HIGH state. Similarly, in a period when data1 is inputted, WORD1 becomes the first HIGH state, and in a period when data0 is inputted, WORD1 becomes the second HIGH state. A TFT in a memory cell corresponding to an address signal designated by a WORD line which becomes the first HIGH state is turned on, and an organic element is short-circuited by a BIT line which becomes the first HIGH state; therefore, writing is performed.

A similar operation is performed in the cases of WORD2 to WORD4. As a result, writing is performed to the organic memory.

By the operating method of the circuit in this embodiment mode, the organic memory to which writing is performed by a writing signal which is externally inputted through the pads with wired connection can be read by a signal which is generated by a logic circuit in accordance with a radio signal. In addition, when operating by the external writing signal inputted with wired connection, the organic memory is not affected by a signal which is generated by the logic circuit. When operating by a reading signal which is generated by the logic circuit in accordance with a radio signal, the organic memory is not affected by the external input.

In addition, in the case of the chip of the invention, data cannot be added unless writing is performed by the external input with wired connection. Accordingly, after a region including the external input portion is sealed, data can be prevented from being falsified unless sealing is broken.

Embodiment Mode 3

In this embodiment mode, description is made of a structure of a radio chip which is different from that in Embodiment Mode 1.

Figure 2A:
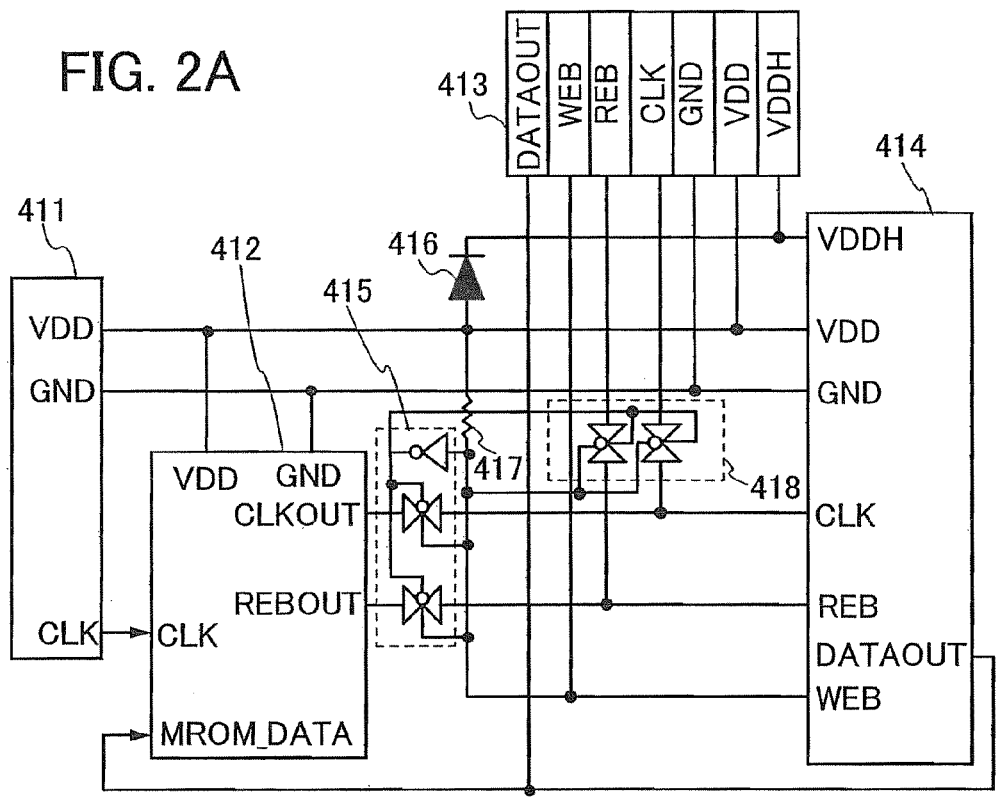
FIGS. 2A and 2B are circuit diagrams of a radio chip of the invention.

FIG. 2A shows a structure of a radio chip which has a different structure of the adjustment circuit portion from that shown in FIG. 1A. The radio chip shown in FIG. 2A includes an RF input portion 411, a logic circuit portion 412, an external signal input portion 413, a memory region 414 including an organic memory, an adjustment circuit portion 415, a diode 416, a resistor 417, and a switching element 418. The adjustment circuit portion 415 of the radio chip of this embodiment mode is constituted by a switch. As a switch an analog switch, or the like can be used. In this embodiment mode, an inverter and an analog switch are used. Analog switches are provided between the logic circuit portion 412 and CLK terminal of the memory region 414, and between the logic circuit portion 412 and REB terminal of the memory region 414. An input terminal of the inverter and a first terminal of an analog switch are connected between the resistor 417 and a WEB terminal. An output terminal of the inverter and a second terminal of the analog switch are connected to each other.

In addition, as the switching element 418, an inverter and an analog switch can be used. In this embodiment mode, an analog switch is provided between a reading signal (REB) input pad and an REB terminal. Further, an analog switch is provided between a CLK pad and a CLK terminal.

The resistor 417 is provided for giving a priority to the external input to WEB when the external input through the external signal input portion 413 is performed to WEB, while VDD is inputted to WEB when the external input is not performed to WEB. The adjustment circuit portion 415 interrupts an unnecessary signal from the logic circuit portion 412 in the case where a LOW signal is externally inputted to WEB, that is, the case where the external input through the external signal input portion 413 is performed. On the other hand, in the case where a HIGH signal is inputted to WEB or the case where the external input is not performed through the external signal input portion 413, the adjustment circuit portion 415 supplies a stable signal to the memory region 414 by interrupting signals of REB and CLK from the external signal input portion 413.

As for a radio chip, a distance between the pad region and the memory region is 500 µm or more and 1 mm or less, and preferably 750 µm or more and 1 mm or less. A circuit or the like as well as the memory region are not preferably provided below the pad region. As a result, data can be written without being affected by stress from pressure-bonding of an antenna. Note that since a conventional radio chip which is formed from a silicon wafer has a certain hardness, it can be connected to the antenna even if a pressure is put upon a place where an element is formed in a face down state. However, the radio chip of the invention is formed from a thin film; therefore, an element such as a memory might be destroyed by stress from pressure-bonding of the antenna if a conventional structure is applied. In the invention, the memory region or the circuit is not formed below the pad region; therefore, a structure where an antenna can be attached by pressure-bonding without destroying the memory or the circuit is applied.

The radio chip in this embodiment mode can be operated similarly to that in the aforementioned embodiment modes.

Figure 2B:
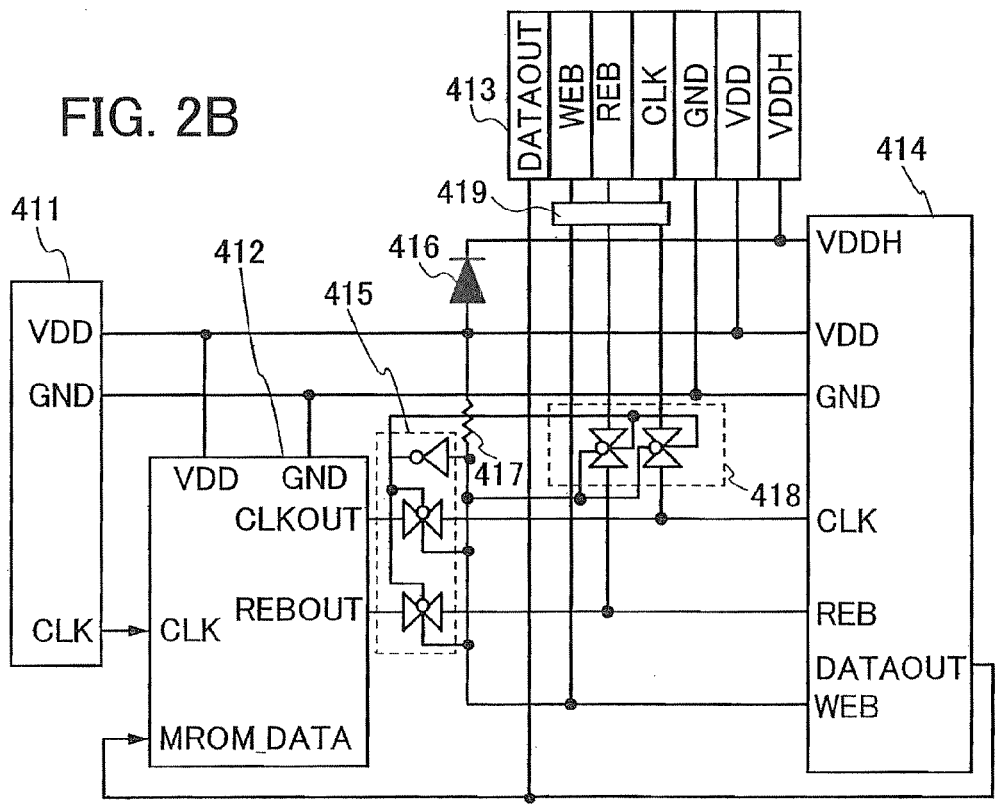

In addition, a protection circuit 419 may be provided as shown in FIG. 2B. The protection circuit 419 is preferably provided near the external signal input portion 413, because static electricity often occurs in the external signal input portion 413. In this embodiment mode, the protection circuit 419 is provided between a WEB pad, the REB pad, and the CLK pad; and the WEB terminal, the REB terminal and the CLK terminal. The protection circuit 419 includes at least one thin film transistor between each pad and each terminal. Note that as a channel length of the thin film transistor is longer, withstand pressure from static electricity or the like can be improved, which is preferable.

By the circuit and the operating method thereof in this embodiment mode, the organic memory to which writing is performed by a writing signal which is externally inputted through the pads with wired connection can be read by a signal which is generated by a logic circuit in accordance with a radio signal. In addition, when operating by the external writing signal inputted with wired connection, the organic memory is not affected by a signal which is generated by the logic circuit. When operating by a reading signal which is generated by the logic circuit in accordance with a radio signal, the organic memory is not affected by the external input.

Embodiment Mode 4

In this embodiment mode, description is made of an operation of the radio chip described in Embodiment Mode 3.

Figure 7:
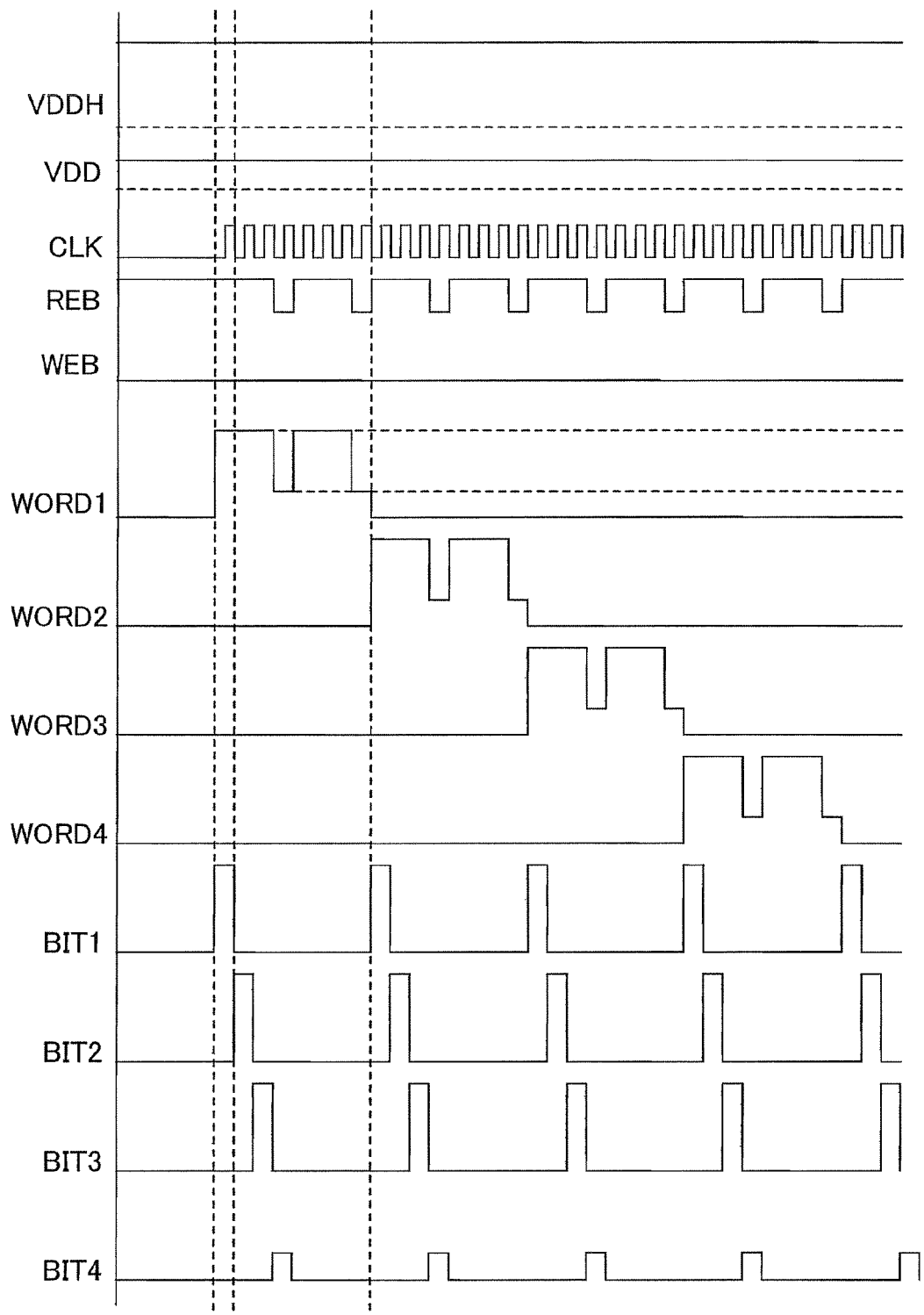
FIG. 7 is a timing chart of an organic memory included in a radio chip of the invention.

Description is made of a timing chart for a writing operation with reference to FIG. 7. FIG. 7 shows waveforms of VDDH, VDD, CLK, REB, and WEB in this order from the top. A value of each voltage is illustrated by an example that VDDH is 10 V, VDD is 3 V, and CLK is 0 V or 3 V.

In addition, FIG. 7 shows waveforms of signals WORD1 to WORD4 inputted to the word lines which form the organic memory and waveforms of signals BIT1 to BIT4 inputted to the bit lines which form the organic memory. A voltage is illustrated by an example that the highest potential of WORD is 10 V, the lowest potential thereof is 0 V, and the medium potential thereof is 3 V.

Actually, 4 or more word lines and bit lines are often provided. For example, in the case of providing 8 word lines and 8 bit lines, selection is performed sequentially from BIT1 each time CLK falls. Then, selection is performed sequentially from WORD1 with a cycle of 8 times as long as BIT selection. By repeating this sequentially, writing can be performed to the organic memory.

A difference from FIG. 4 described in Embodiment Mode 2 is that the waveform of WEB is continuously in a LOW state. Other timings are similar to those in FIG. 4, and description thereof is omitted.

As described above, writing can be performed to the organic memory.

Figure 8:
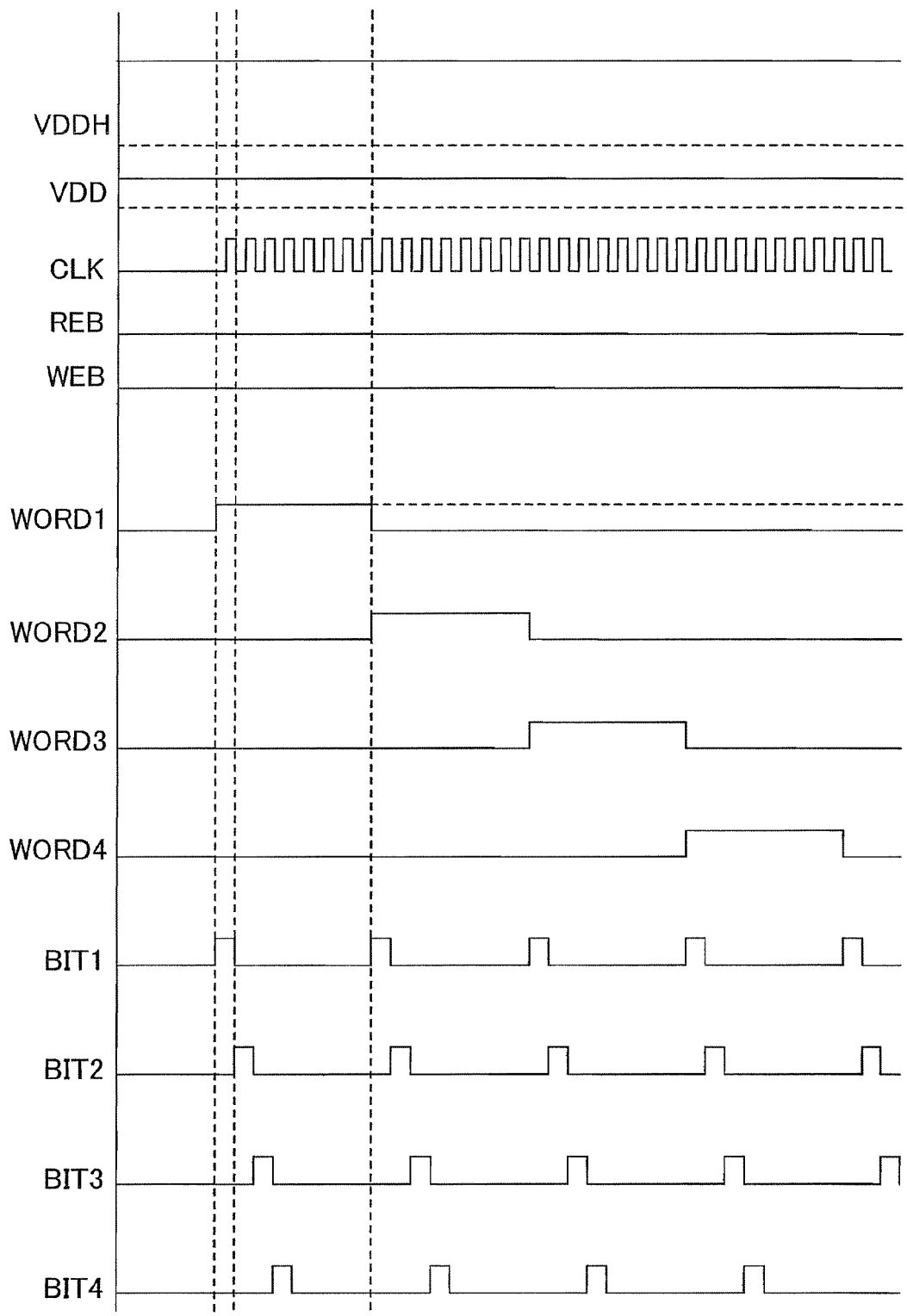
FIG. 8 is a timing chart of an organic memory included in a radio chip of the invention.

Next, description is made of a timing chart for a reading operation with reference to FIG. 8. FIG. 8 shows waveforms of VDDH, VDD, CLK, REB, and WEB in this order from the top. A value of each voltage is illustrated by an example that VDDH is 10 V, VDD is 3 V, and CLK is 0 V or 3 V.

In addition, FIG. 8 shows waveforms of signals WORD1 to WORD4 inputted to the word lines which form the organic memory and waveforms of signals BIT1 to BIT4 inputted to the bit lines which form the organic memory. A voltage is illustrated by an example that the highest potential of WORD is 10 V, and the lowest potential thereof is 0 V.

4 or more word lines and bit lines are often provided. For example, in the case of providing 8 word lines and 8 bit lines similarly to FIG. 4, selection is performed sequentially from BIT1 each time CLK falls. Then, selection is performed sequentially from WORD1 with a cycle of 8 times as long as BIT selection.

A difference from FIG. 5 described in Embodiment Mode 2 is that the waveforms of REB and WEB are continuously in a LOW state. Other timings are similar to those in FIG. 5, and description thereof is omitted.

As described above, reading can be performed from the organic memory.

FIG. 6A is a timing chart in the case of writing and shows waveforms of REB, WEB, and CLK. At this time, a period of CLK is set to be about 1 ms. In the case of the organic memory in this embodiment mode, a standby period is provided when no signal is inputted. A reset state cannot be obtained by setting WEB and REB to be in a HIGH state due to a structure of a circuit; therefore, the standby period when CLK is not operated is provided when writing or reading is not performed. When REB becomes a HIGH state, HIGH(1) is written to the organic memory. Next, when REB becomes a LOW state, writing is not performed to the organic memory. In this embodiment mode, WEB maintains a LOW state. This is because in a circuit structure shown in FIGS. 2A and 2B, switches of CLK and REB which are externally inputted become an off state when WEB becomes a HIGH state; therefore, CLK and REB are not inputted to the organic memory. On the other hand, when the organic memory is operated by a radio signal, WEB is set to be in a HIGH state in order not to be affected by the external input. By repeating such periods sequentially, writing is performed to the organic memory.

FIG. 6B is a timing chart in the case of reading and shows waveforms of REB, WEB, and CLK. In this case, a period of CLK is set to be about 10 μm. The standby period is when REB is in a HIGH state and WEB is in a LOW state. Subsequently, REB becomes a LOW state, and a reading period starts.

In this embodiment mode, reset is not performed by a signal. However, an address signal is returned to an initial value when all power supply potentials are turned off. Therefore, when writing and reading temporarily stop being performed, that is, when an address cannot be advanced, CLK is required to be in an off state. In other words, when writing or reading is performed by the external input, WEB is continuously in a LOW state. Further, when writing is performed, REB is set to be in a HIGH state. When reading is performed or writing is not performed to a specific memory cell while writing is performed, REB is set to be in a LOW state.

By the operating method of the circuit in this embodiment mode, the organic memory to which writing is performed by a writing signal which is externally inputted through the pads with wired connection can be read by a signal which is generated by a logic circuit in accordance with a radio signal. In addition, when operating by the external writing signal inputted with wired connection, the organic memory is not affected by a signal which is generated by the logic circuit. When operating by a reading signal which is generated by the logic circuit in accordance with a radio signal, the organic memory is not affected by the external input.

In addition, in the case of the chip of the invention, data cannot be added unless writing is performed by the external input with wired connection. Accordingly, after a region including the external input portion is sealed, data can be prevented from being falsified unless sealing is broken.

Embodiment Mode 5

In this embodiment mode, description is made of prevention of mixture of signals from the logic circuit when the external input with wired connection is performed.

When the external input with wired connection is performed, VDD and GND are supplied externally, and at the same time, VVD and GND enter the logic circuit as well due to a circuit structure. This is why measures are taken to prevent an unnecessary signal (such as a clock signal and a reading signal which are generated internally) by the logic circuit from being noise of an external input signal.

In structures shown in FIGS. 1A and 1B, the resistor is provided with an output of the logic circuit. Therefore, a signal from the logic circuit is reflected when there is no signal from the external input, and a signal which is inputted from the external signal has a priority when inputted.

In structures shown in FIGS. 2A and 2B, a signal from the logic circuit is interrupted when the external input is performed by the analog switch. The analog switch is controlled by WEB, which is one of external input signals. Accordingly, when WEB is in a HIGH state, REB and CLK which are externally inputted are interrupted.

Further, in the structures shown in FIGS. 1A, 1B, 2A and 2B, WEB is connected to VDD through the resistor in order to perform a pull-up operation. Therefore, when the external input is not performed, WEB can be continuously in a HIGH state.

Embodiment Mode 6

In this embodiment mode, description is made of an example of a mask layout of a radio chip.

Figure 9A:
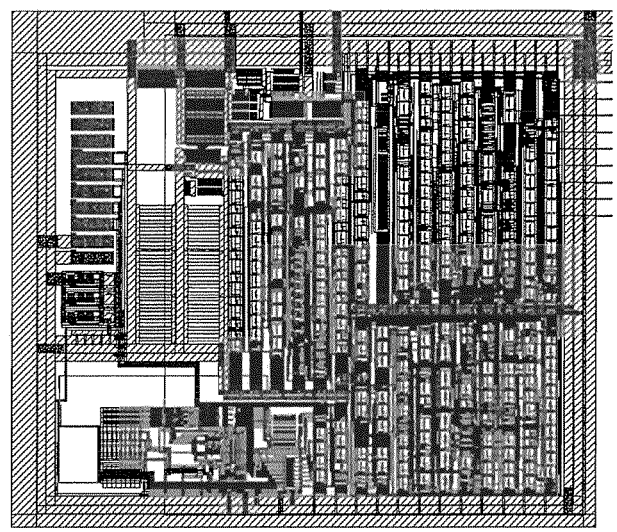
FIGS. 9A and 9B are top views of a radio chip of the invention.
Figure 9B:
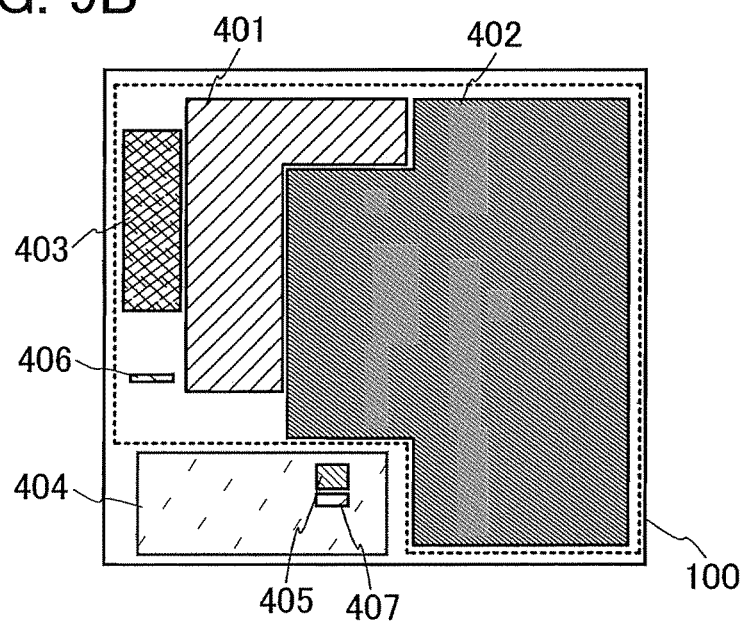

FIG. 9A shows an example of a mask layout of the radio chip. FIG. 9B shows a block diagram of an arrangement of the RF input portion 401, the logic circuit portion 402, the external signal input portion 403, the memory region 404 including the organic memory, the adjustment circuit portion 405, the diode 406, and the resistor 407 in a radio chip 100.

In the radio chip 100, the logic circuit portion 402, which occupies the largest area in the radio chip 100, is provided, and the RF input portion 401 and the memory region 404 including the organic memory are provided adjacent to the logic circuit portion 402. One region of the memory region 404 is provided with the adjustment circuit portion 405 and the resistor 407 which are adjacent to each other. The external signal input portion 403 is provided adjacent to the RF input portion 401. The external signal input portion 403 which includes pads is preferably provided in a region which is in contact with one side of the radio chip 100, and thereby the antenna can be pasted using one side of the radio chip as a basis when being connected.

A distance between the pad region and the memory region 404 is 500 μm or more and 1 mm or less, and preferably 750 μm or more and 1 mm or less. That is, the memory region and the pad region are formed so as not to overlap with each other. Preferably, a wire (lead wire) leading from the pad and the memory region are formed so as not to overlap with each other, which can prevent stress from pressure-bonding of an antenna from being applied to the memory region 404 through the lead wire. Note that a conventional radio chip which is formed from a silicon wafer has a certain hardness, it can be connected to the antenna even if pressure is put upon a place where an element is formed in a face down state. However, the radio chip of the invention is formed from a thin film; an element might be destroyed by stress from pressure-bonding of the antenna if a conventional structure is applied. In the case of the radio chip of the invention, the memory region or the circuit is not formed below the pad region and the lead wire.

More preferably, a structure where a circuit with a specific function other than the memory region does not overlap with the pads is employed. That is, an element of a circuit with a specific function is not formed below the pads. As a result, data can be processed without being affected by stress from pressure-bonding of the antenna.

Note that the mask layout in this embodiment mode can be applied when structures shown in the aforementioned embodiment modes are implemented.

Embodiment Mode 7

In this embodiment mode, description is made of a structure of a memory (also referred to as a memory device) provided in a memory region and an operation thereof.

Figure 10:
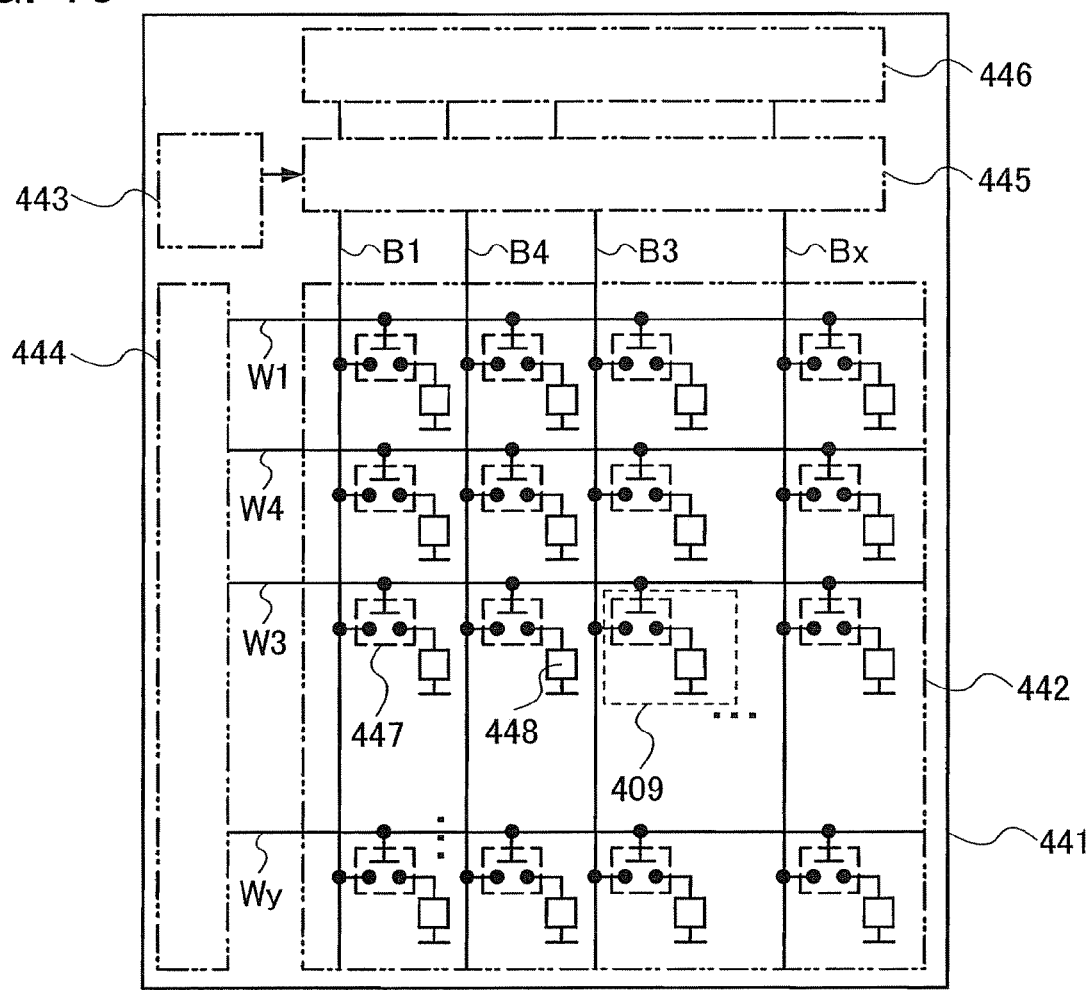
FIG. 10 is a circuit diagram of an organic memory included in a radio chip of the invention.

FIG. 10 shows a structure of a memory 441. The memory of the invention includes a memory cell array 442 in which memory cells 409 are arranged in matrix, decoders 443 and 444, a selector 445, and a reading/writing circuit 446. The memory cell 409 includes a memory element 448 and a switching element 447, which is referred to as an active memory. As for another structure of a memory, there is a passive memory in which a switching element is not provided. The invention can be applied to a passive memory as well.

The memory cell 409 is provided in an intersecting region of a bit line Bx ($1 \leq x \leq m$) and a word line Wy ($1 \leq y \leq n$). The memory element 448 has a structure including an organic compound layer between a first conductive layer which forms the bit line and a second conductive layer which forms the word line.

A gate electrode of the switching element 447 is connected to the word line Wy ($1 \leq y \leq n$). One of a source electrode and a drain electrode of the switching element 447 is connected to the bit line Bx ($1 \leq x \leq m$). The other of the source electrode and the drain electrode thereof is connected to one electrode of the memory element 448.

Writing and reading can be performed to the memory element 448 by electrical or optical action. In the case where writing or reading is performed by optical action, one or both of the first conductive layer and the second conductive layer are required to have a light-transmitting property. A conductive layer having a light-transmitting property is formed by using a light-transmitting conductive material such as indium tin oxide (ITO) or formed to so as have a thickness enough to transmit light even when a light-transmitting conductive material is not used.

Figure 11:
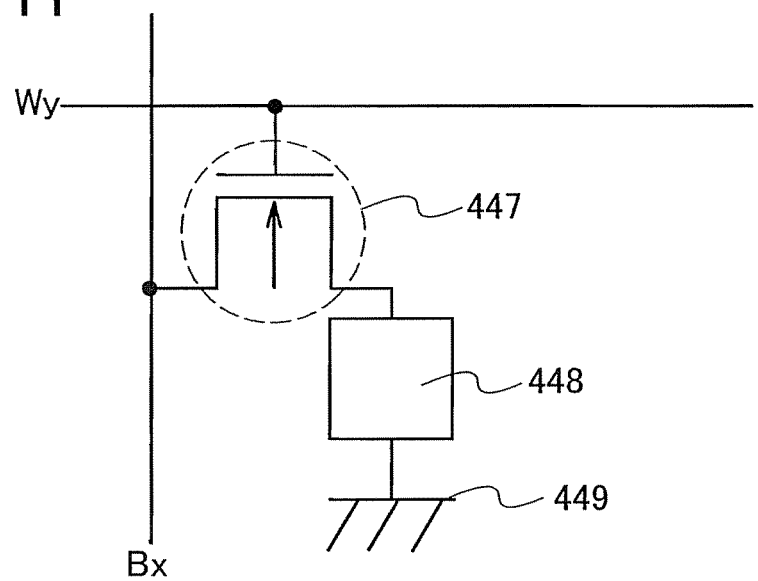
FIG. 11 is a circuit diagram of an organic memory cell included in a radio chip of the invention.

FIG. 11 shows a structure example of the memory cell 409.

The memory cell 409 includes the switching element 447 and the memory element 448 as shown in FIG. 11. As the switching element 447, a thin film transistor can be used. In the case of using a thin film transistor, the switching element 447 and circuits such as the decoder 443 and the selector 445 can be formed at the same time, which is preferable.

The memory element 448 includes a first conductive layer, an organic compound layer, and a second conductive layer. The second conductive layer can be shared by the memory cells in the memory cell array 442, which is referred to as a common electrode 449. The common electrode functions to apply a common potential to all memory cells when reading and writing of a memory device is performed.

The memory device having the aforementioned structure can be used as a volatile memory, typically as DRAM (Dynamic Random Access Memory).

The pad region is provided so as to have a distance of 500 μm or more and 1 mm or less, and preferably 750 μm or more and 1 mm or less from such a memory region, specifically a region in which the memory element is formed. In particular, the memory is often strongly affected by stress from pressure-bonding of an antenna because of including the organic compound layer; however, as a predetermined distance is maintained between the memory region and the pad region, data can be written without being affected by stress from pressure-bonding of the antenna, and the like, as described above.

Embodiment Mode 8

In this embodiment mode, description is made of a manufacturing method of the radio chip.

Figure 12A:
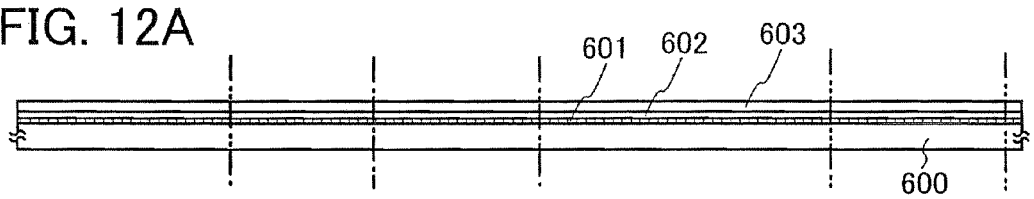
FIGS. 12A to 12D are views showing manufacturing steps of a radio chip of the invention.

As shown in FIG. 12A, a separation layer 601, an insulating layer 602, and a semiconductor film 603 are formed in this order over a substrate having an insulating surface 600 (hereinafter also referred to as an insulating substrate). As the insulating substrate 600, a grass substrate, a quartz substrate, a substrate formed of silicon, a metal substrate, a plastic substrate, or the like can be used. Further, the insulating substrate 600 may be thinned by polishing. By using the thinned insulating substrate, an end product can be lighter and thinner.

The separation layer 601 can be formed by using an element selected from tungsten (W), titanium (Ti), tantalum (Ta), molybdenum (Mo), niobium (Nb), neodymium (Nd), nickel (Ni), cobalt (Co), zirconium (Zr), zinc (Zn), ruthenium (Ru), rhodium (Rh), palladium (Pd), osmium (Os), iridium (Ir), and silicon (Si), or an alloy material or a compound material containing the aforementioned element as a main component. A single layer structure of the aforementioned element or the like or a stacked-layer structure of the aforementioned element or the like can be used for the separation layer 601. The separation layer 601 can be formed by a CVD method, a sputtering method, using an electron beam, or the like. In this embodiment mode, the separation layer 601 is formed using W by a CVD method. In this case, plasma treatment is preferably performed using $O_2$, $N_2$, or $N_2O$, and thereby a separation step that is a following step can be easily performed. In addition, the separation layer 601 is not required to be formed over the entire insulating substrate and may be formed selectively over the insulating substrate. That is, the separation layer 601 is formed in order to peel the insulating substrate 600 afterwards, and a region where the separation layer is formed is not limited.

As the insulating layer 602, an inorganic material such as silicon oxide or silicon nitride can be used. The insulating layer 602 can have a single layer structure or a stacked-layer structure. By using silicon nitride, intrusion of an impurity element from the insulating substrate 600 can be prevented. In the case where the insulating layer 602 is formed so as to have a stacked-layer structure, silicon nitride is contained in any one of the layers, which produces an effect.

The semiconductor film 603 can be formed by using a material containing silicon. The semiconductor film can be formed by a CVD method or a sputtering method. A crystal structure of the semiconductor film 603 may be any of an amorphous structure, a crystalline structure, or a microcrystalline structure. The higher crystallinity is, the more mobility of a thin film transistor can be increased, which is preferable. Further, as for a microcrystalline structure and an amorphous structure, a crystalline state of adjacent conductive layers is not varied, which is preferable.

The crystalline semiconductor film 603 is sometimes directly formed over the insulating layer 602 and sometimes formed by heating an amorphous semiconductor film which is formed over the insulating layer 602. For example, the amorphous semiconductor film is treated by a heating furnace or heated by laser irradiation. As a result, the semiconductor film having high crystallinity can be formed. In this case, a metal element which promotes crystallization can be used in order to lower a heating temperature. For example, nickel (Ni) is added on a surface of the amorphous semiconductor film and a heating treatment is performed; thereby, a temperature required for crystallization can be lowered. Accordingly, the crystalline semiconductor film can be formed over the insulating substrate 600 having low heat resistance. Note that in the case of using laser irradiation, heat resistance of the insulating substrate 600 which is employed is not limited because the semiconductor film can be selectively heated.

Figure 12B:
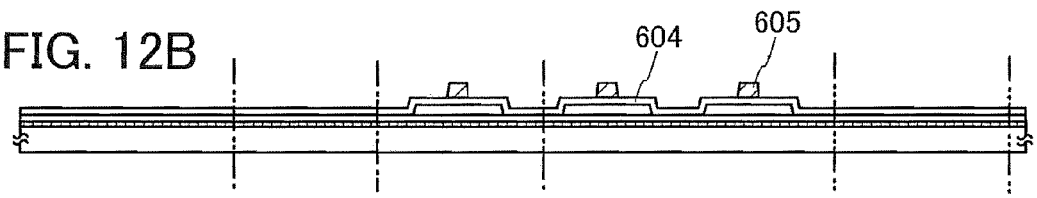

As shown in FIG. 12B, the semiconductor film 603 is processed so as to have a predetermined shape. As for processing, etching using a mask which is formed by a photolithography method can be employed. As for etching, a dry etching method or a wet etching method can be employed.

An insulating layer which functions as a gate insulating film 604 is formed so as to cover the processed semiconductor film. The gate insulating film 604 can be formed using an inorganic material. For example, silicon nitride or silicon oxide can be used. Plasma treatment may be performed before or after the gate insulating film 604 is formed. Oxygen plasma or hydrogen plasma can be used for plasma treatment. By such plasma treatment, an impurity on a formation surface of the gate insulating film or a surface thereof can be removed.

Subsequently, a conductive layer which functions as a gate electrode 605 is formed over the semiconductor film 603 with the gate insulating film 604 interposed therebetween. The gate electrode 605 can have a single layer structure or a stacked-layer structure. For the gate electrode 605, an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminium (Al), gold (Au), silver (Ag), copper (Cu), and indium (In), or an alloy material or a compound material containing the aforementioned element as a main component can be used.

Figure 12C:
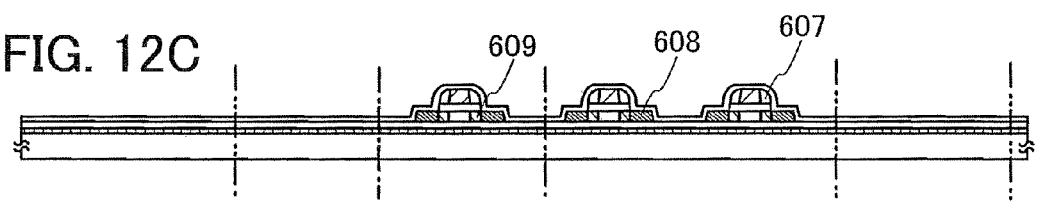

As shown in FIG. 12C, an insulator which functions as a sidewall 607 is formed over a side surface of the gate electrode 605. The sidewall 607 can be formed using an inorganic material or an organic material. As an inorganic material, silicon oxide or silicon nitride can be used. For example, when silicon oxide is formed so as to cover the gate electrode 605 and isotropic etching is performed, silicon oxide remains only over the side surface of the gate electrode 605. The remaining silicon oxide can be used as the sidewall 607. As for isotropic etching, a dry etching method or a wet etching method can be used. When the sidewall 607 is processed, the gate insulating film 604 is etched to be removed. As a result, a part of the semiconductor film is exposed.

An impurity element is added to the semiconductor film 603 in a self-aligned manner by using the sidewall 607 and the gate electrode 605. Accordingly, an impurity region having different impurity concentration is formed in the semiconductor film 603. An impurity region 609 which is provided below the sidewall 607 has lower impurity concentration than an impurity region 608 which is formed in the exposed semiconductor film. Concentrations of the impurity regions are differentiated in such a manner, and thereby a short channel effect can be prevented.

Figure 12D:
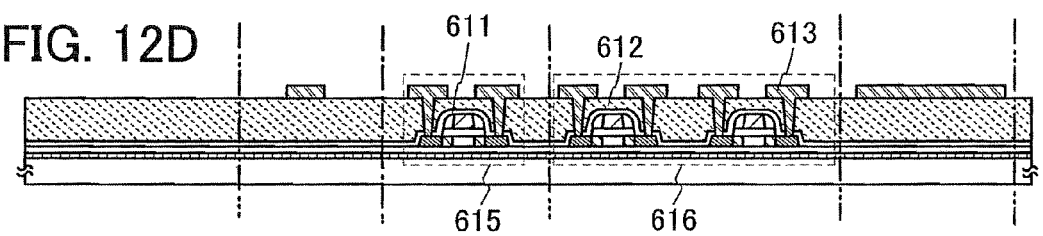

As shown in FIG. 12D, insulating layers 611 and 612 are formed so as to cover the semiconductor film 603, the gate electrode 605, and the like. The insulating layers which cover the semiconductor film 603, the gate electrode 605, and the like may have a single layer structure, and preferably have a stacked-layer structure as in this embodiment mode. This is because intrusion of an impurity can be prevented by forming the insulating layer 611 by using an inorganic material. This is also because a dangling bond in the semiconductor film can be terminated using hydrogen in the insulating layer 611 by forming a film using an inorganic material by a CVD method. Subsequently, the insulating layer 612 is formed using an organic material, so that planarity can be improved. As an organic material, polyimide, acrylic, polyamide, polyimide amide, resist, benzocyclobutene, siloxane, or polysilazane can be used. Note that siloxane includes a skeleton structure formed of a bond of silicon (Si) and oxygen (O). An organic group containing at least hydrogen (for example, an alkyl group or aromatic hydrocarbon) is used as a substituent. A fluoro group may be used as the substituent. Alternatively, a fluoro group and an organic group containing at least hydrogen may be used as the substituent. Polysilazane is formed using a polymer material having a bond of silicon (Si) and nitrogen (N) as a starting material.

Subsequently, a wire 613 which penetrates the insulating layers 611 and 612 and the gate insulating film 604 and is connected to the impurity region 608 is formed. The wire 613 can have a single layer structure or a stacked-layer structure. The wire 613 can be formed using an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminium (Al), gold (Au), silver (Ag), copper (Cu), and indium (In), or an alloy material containing the aforementioned element as a main component.

Other wires can be formed over the insulating layer 612 simultaneously with the wire 613. Other wires correspond to a lead wire and the like.

As described above, a thin film transistor (TFT) 615 and a TFT group 616 can be formed. The TFT group 616 means a group of TFTs which forms a circuit with a certain function.

Figure 13A:
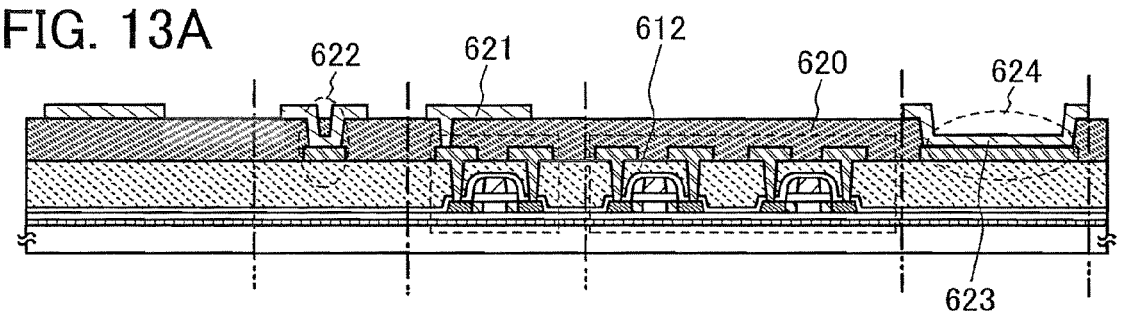
FIGS. 13A to 13C are views showing manufacturing steps of a radio chip of the invention.

Subsequently, as shown in FIG. 13A, an insulating layer 620 is formed over the insulating layer 612. The insulating layer 620 can be formed using an inorganic material or an organic material similarly to the insulating layers 611 and 612. A wire 621 is formed so as to penetrate the insulating layer 620. The wire 621 can be formed similarly to the wire 613. The wire 621 is electrically connected to the wire 613 in a region 622 through an opening provided in the insulating layer 620. In the region 622, a common electrode of a memory element, which is formed later, can be grounded. A pad 623 is formed from the same layer as the wire 621. The pad 623 is electrically connected to the wire 613 in a region 624 through the opening provided in the insulating layer 620.

Figure 13B:
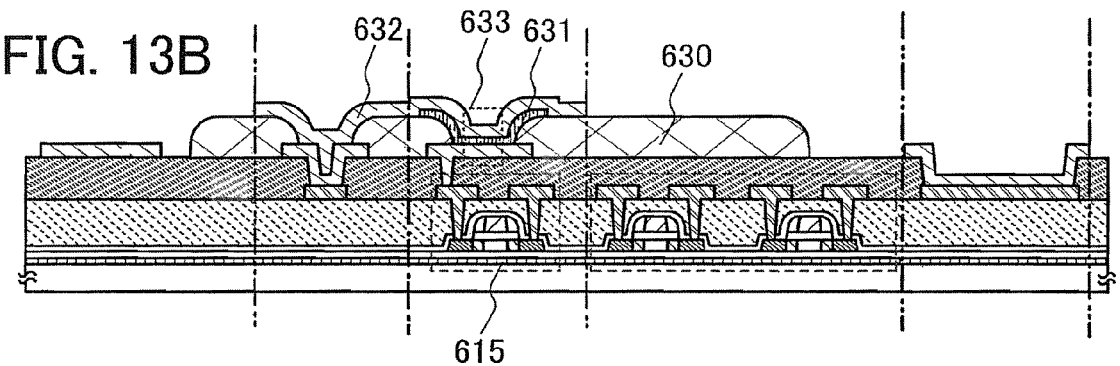

As shown in FIG. 13B, an insulating layer 630 is formed over the insulating layer 620. The insulating layer 630 can be formed using an inorganic material or an organic material similarly to the insulating layers 611 and 612. The insulating layer 630 is provided with an opening. The insulating layer 630 is processed so that a side surface of the opening has a tapered shape.

An organic compound layer 631 is formed in an opening which is provided over the TFT 615. The organic compound layer 631 can be formed by a vapor deposition method or a sputtering method. Such an organic compound layer can be formed using a known electroluminescent material. Then, a wire 632 is formed so as to cover the organic compound layer 631 and a part of the insulating layer 630. The wire 632 can be formed similarly to the wire 621. A region where the wire 632 is formed functions as a memory region and a contact region. The wire 632 functions as the common electrode of the memory element 633.

Figure 13C:
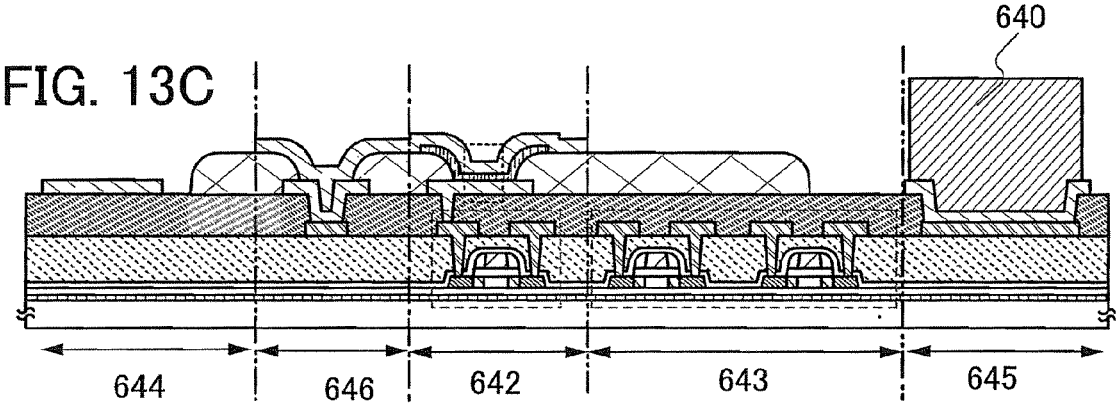

An antenna 640 is formed as shown in FIG. 13C. At this time, the antenna 640 is electrically connected to the pad 623 by thermocompression bonding. As described above, a radio chip is formed including a wire region 644 where a lead wire and the like are formed, a memory region 642 where the memory element is formed, an integrated circuit region 643 where the TFT group is included and a circuit with a specific function is formed, a pad region 645 and a contact region 646. The pad region and the memory region are provided so as to have a distance of approximately 500 μm or more and preferably of approximately 750 μm or more. As a result, data can be written without being affected by stress from pressure-bonding of the antenna.

In addition, pressure-bonding of the antenna is preferably performed in a state where flexibility of the insulating substrate 600 is low. In this embodiment mode, description is made of a mode where the antenna is transposed to a film substrate after the antenna is attached by pressure-bonding.

Figure 14A:
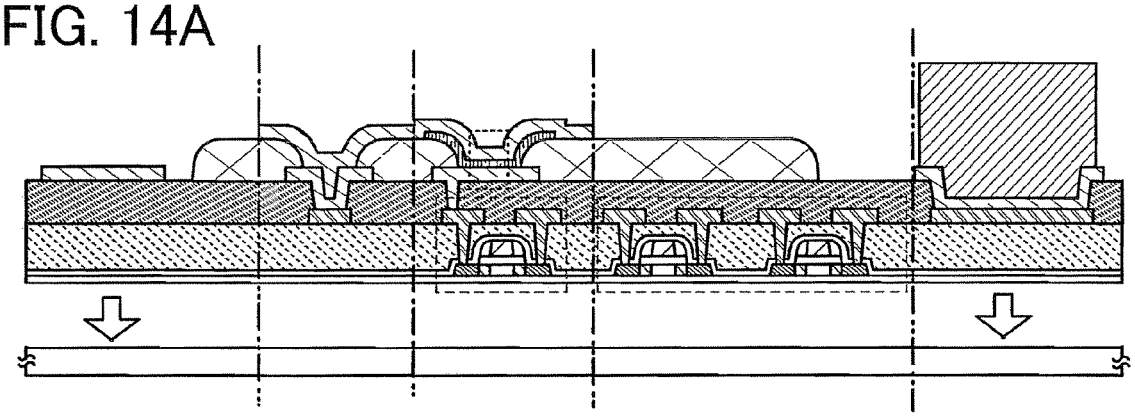
FIGS. 14A and 14B are views showing manufacturing steps of a radio chip of the invention.

As shown in FIG. 14A, the insulating substrate 600 is peeled by removing the separation layer 601. The separation layer 601 can be removed physically or chemically. For example, a crystal structure of the separation layer 601 can be changed as well by heat treatment of the semiconductor film, or the like. Subsequently, an opening is provided so that a part of the separation layer 601 is exposed, and the exposed separation layer 601 is irradiated with a laser. By performing laser irradiation to the separation layer 601, a trigger for separation can be obtained. Therefore, the thin film transistor or the like can be peeled from the insulating substrate 600 physically. Consequently, the thin film transistor or the like is sometimes naturally peeled off from the insulating substrate 600 due to stress of the film with no extra power applied. Alternatively, the separation layer 601 can be removed by forming an opening which reaches the separation layer 601, introducing an etching agent through the opening, and using a chemical reaction.

Figure 14B:
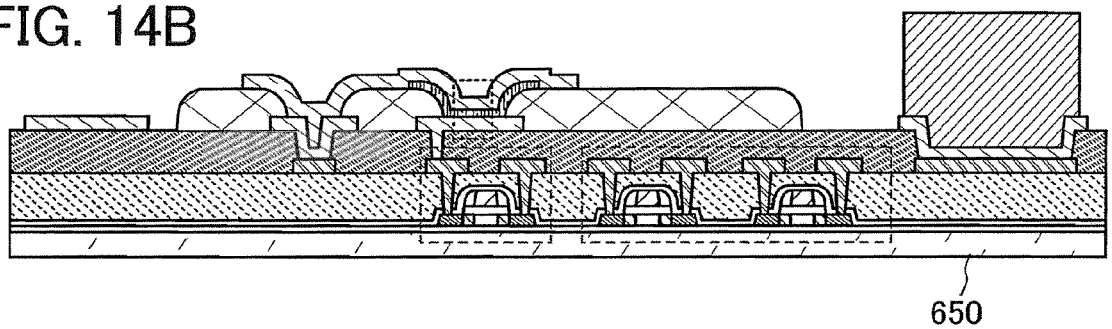

Subsequently, as shown in FIG. 14B, the peeled thin film transistor or the like and a film substrate 650 are attached to each other. They can be attached to each other without adhesive when a surface of the film substrate 650 has an adhesive property. When the surface of the film substrate 650 does not have an adhesive property, the thin film transistor or the like and a film substrate 650 can be attached to each other using adhesive.

As described above, the radio chip in which the thin film transistor or the like is transposed to the film substrate can be formed. Such a radio chip and an organic memory region are formed over one substrate, and the radio chip has added values such as reduction in weight and thickness, and flexibility.

Embodiment Mode 9

In this embodiment mode, description is made of a shape of an antenna formed over an antenna substrate, which is applied to a radio chip including the memory element of the invention.

As a signal transmission method of the radio chip, an electromagnetic coupling method or an electromagnetic induction method (for example, the 13.56 MHz band) can be applied. In the case of employing an electromagnetic induction method, a conductive layer which functions as an antenna is formed into an annular shape (for example, a loop antenna) or a spiral shape (for example, a spiral antenna) in order to use electromagnetic induction caused by a change in magnetic field density.

Further, when a microwave method (for example, a UHF band (the 860 to 960 MHz band), the 2.45 GHz band, or the like) is applied as a signal transmission method of the radio chip, a shape such as the length of the conductive layer which functions as an antenna is determined in view of the wavelength of an electromagnetic wave used for signal transmission. For example, the conductive layer which functions as an antenna can be formed into a linear shape (for example, a dipole antenna), a flat shape (for example, a patch antenna), a ribbon shape, or the like. The shape of the conductive layer which functions as an antenna is not limited to a linear shape, and it may be formed so as to have a curved line shape, a meander shape, or a combination thereof in view of the wavelength of an electromagnetic wave.

Figure 15A:
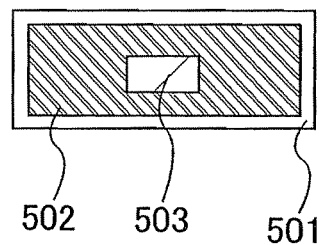
FIGS. 15A to 15C are views showing an antenna mounted on a radio chip of the invention.

FIG. 15A shows an example where a conductive layer 502 which functions as a patch antenna is used as an antenna. An integrated circuit 503 in which an antenna substrate 501 includes a memory region or the like is attached to the conductive layer 502 which functions as a patch antenna. A patch antenna has very high directivity, and directivity in one direction can be improved by a shape of the antenna. As for a frequency band, a UHF band of 900 to 980 MHz or a microwave band of 2.45 GHz or the like can be used.

Figure 15B:
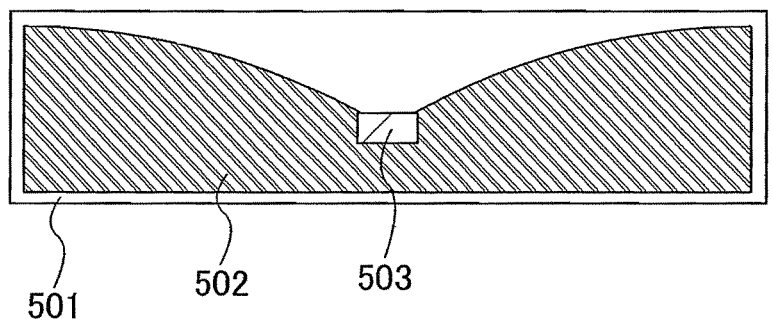

FIG. 15B shows an example where a conductive layer functioning as an antenna is formed into a ribbon shape (also referred to as a fan shape). This is a kind of a monopole-type or dipole-type antennas, and similarly to other antennas, transmission in a short wave band of 13.56 MHz or the like, a UHF band of 950 to 956 MHz or the like, or a microwave band typified by 2.45 GHz can be used. In FIG. 15B, the integrated circuit 503 which includes the memory region or the like is attached to the antenna substrate 501 in which the conductive layer 502 functioning as a patch antenna is formed.

Figure 15C:
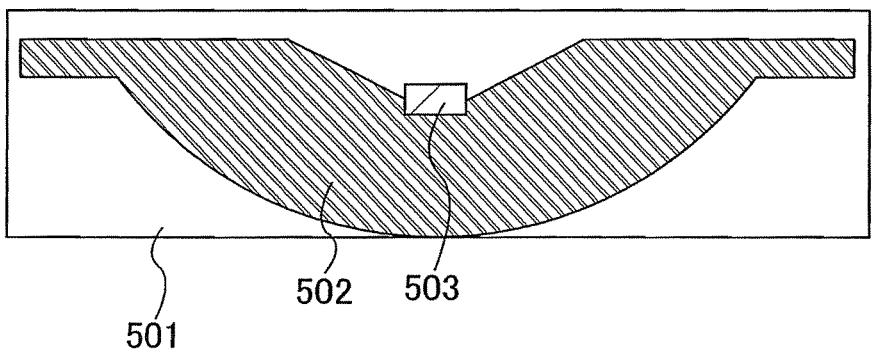

FIG. 15C shows an example of a monopole or dipole antenna in which a conductive layer functioning as an antenna is formed into a wide linear shape, that is, a straight line shape. A shape of the antenna is appropriately determined in accordance with directivity or impedance of the antenna. In FIG. 15C, the integrated circuit 503 which includes the memory region or the like is attached to the antenna substrate 501 in which the conductive layer 502 functioning as a patch antenna is formed. A patch antenna has very high directivity, and directivity in one direction can be improved by a shape of the antenna. As for a frequency band, the UHF band of 900 to 980 MHz or a microwave band of 2.45 GHz or the like can be used.

The radio chip provided with a patch antenna is excellent in directivity; therefore, it is appropriate to be used for preventing leakage of information in order to take security measures or protect privacy. Further, communication can be achieved in a state where the radio tag is included in packaging; therefore, it can be applied to product management or the like.

A conductive layer which functions as an antenna is formed over an antenna substrate using a conductive material by a CVD method, a sputtering method, a printing method such as screen printing or gravure printing, a droplet discharging method, a dispenser method, a plating method, or the like. As a conductive material, an element selected from aluminium (Al), titanium (Ti), silver (Ag), copper (Cu), gold (Au), platinum (Pt), nickel (Ni), palladium (Pd), tantalum (Ta), molybdenum (Mo), or indium (In), or an alloy material or a compound material containing the aforementioned element as a main component can be used. The conductive layer is formed so as to have a single layer structure or a stacked-layer structure.

For example, when a conductive layer functioning as an antenna is formed by using a screen printing method, the conductive layer can be provided by selectively printing a conductive paste in which conductive particles with the grain size of several nm to several tens of μm are dissolved or dispersed in an organic resin. As a conductive particle, a metal particle selected from one or more of silver (Ag), gold (Au), copper (Cu), nickel (Ni), platinum (Pt), palladium (Pd), tantalum (Ta), molybdenum (Mo), titanium (Ti), and the like, a fine particle of silver halide, or a dispersible nanoparticle can be used. Further, as an organic resin included in conductive paste, one or a plurality of organic resins each serving as a binder, a solvent, a dispersant, or a coating of a metal particle can be used. Typically, an organic resin such as an epoxy resin or a silicon resin can be used. In forming the conductive layer, baking is preferably performed after the conductive paste is pushed out. For example, in the case of using a fine particle (with the grain size of 1 to 100 nm, for example) containing silver as a main component as a material of the conductive paste, the conductive layer can be obtained by baking the conductive paste at temperatures of 150 to 300° C. so as to be cured. Alternatively, a fine particle containing solder or lead-free solder as a main component may be used; in this case, it is preferable to use a fine particle with the grain size of 20 μm or less. Solder and lead-free solder have an advantage such as low cost.

In addition, ceramic, ferrite, or the like may be applied to an antenna other than the aforementioned materials.

When an electromagnetic coupling method or an electromagnetic induction method is applied, and a radio chip including an antenna is provided in contact with a metal film, a magnetic material having magnetic permeability is preferably provided between the radio chip and the metal film. If a material having magnetic permeability is not provided between the radio chip and the metal film, an eddy current flows to the metal film in accordance with a change in a magnetic field, and the change in magnetic field is impaired by a demagnetizing field which is generated by an eddy current, thereby a communication range is decreased. However, a material having magnetic permeability is provided between the radio chip and the metal film, which can suppress an eddy current of the metal film and a decrease in a communication range. Note that as a magnetic material, a metal thin film or ferrite which has high magnetic permeability and little loss of high frequency waves can be used.

As described above, the radio chip to which an antenna formed over the antenna substrate is bonded can be provided Embodiment Mode 10

In this embodiment mode, description is made of a mode of a radio chip with an antenna.

Figure 16A:
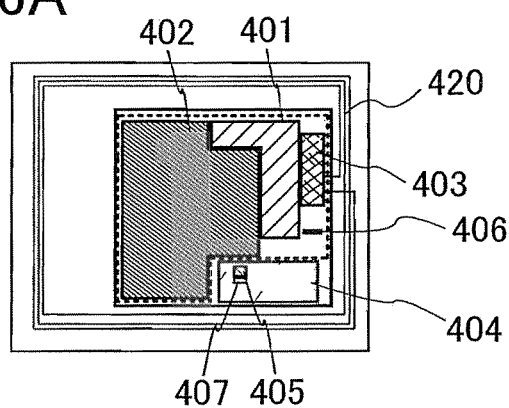
FIGS. 16A and 16B are views showing a radio chip on which an antenna of the invention is mounted.

FIG. 16A shows a radio chip with a coiled antenna. The radio chip includes the RF input portion 401, the logic circuit portion 402, the external signal input portion 403, the memory region 404 including an organic memory, the adjustment circuit portion 405, the diode 406 and the resistor 407.

A coiled antenna 420 is connected to the RF input portion 401 by using an ACF (Anisotropic Conductive Film) which includes an electric conductor and an adhesive property. Instead of using an ACF, a conductive adhesive such as silver paste, copper paste, or carbon paste, NCP (Non Conductive Paste), a solder joint, or the like can be used to connect an antenna.

The coiled antenna 420 is formed over the antenna substrate so as to be in a state where a linear (narrow) conductive layer is coiled so that the antenna becomes larger from the center toward the outside, that is, from a side near a region where the radio chip is provided to a side far from the region. In this embodiment mode, the coiled antenna includes at least 4 angles or more because it has a rectangular shape. An electromagnetic coupling method or an electromagnetic induction method (for example, the 13.56 MHz band) is applied to such a coiled antenna. When an electromagnetic coupling method or an electromagnetic induction method is applied, an antenna is formed into a coil shape in order to use electromagnetic induction caused by a change in magnetic field density. An electromagnetic induction method has features such as high directivity of an antenna and a wide communication range. As for a frequency band, a long wave band of 135 kHz or the like; or a short wave band of 13.56 MHz or the like is used. A communication range is from several to several tens of cm.

Figure 16B:
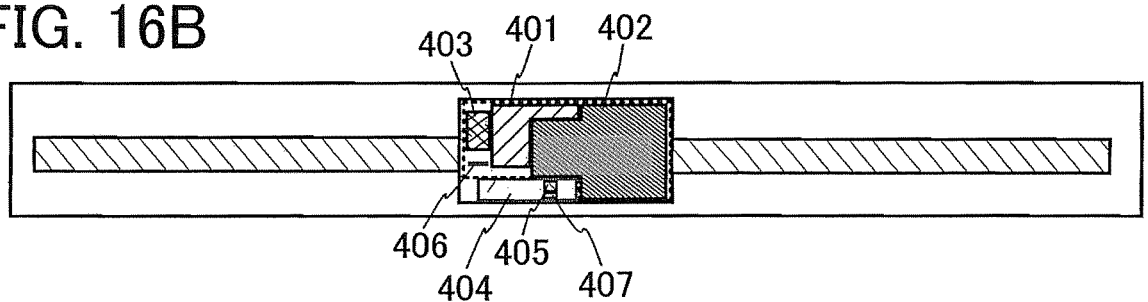

FIG. 16B shows the radio chip with a dipole antenna or a monopole antenna. Similarly to FIG. 16A, the radio chip includes the RF input portion 401, the logic circuit portion 402, the external signal input portion 403, the memory region 404 including an organic memory, the adjustment circuit portion 405, the diode 406 and the resistor 407. Although a dipole antenna has no directivity, a communication range can be extended for about 1 to 6 meters if ultra high frequency waves (UHF band) of the 900 MHz band (for example, 950 to 956 MHz) is used. Further, communication with high directivity can be achieved if a microwave band typified by 2.45 GHz is used. When a communication range is not required to be long, an antenna can be made small, and high-security radio frequency identification and the like can be performed in combination with high directivity. In any case, such a structure can prevent the radio chip and especially the memory region from being destroyed or transformed by pressure-bonding of an antenna.

The dipole antenna is connected to the RF input portion 401 by using an ACF (Anisotropic Conductive Film) which includes an electric conductor and an adhesive property. Instead of using an ACF, a conductive adhesive such as silver paste, copper paste, or carbon paste, NCP (Non Conductive Paste), a solder joint, or the like can be used to connect an antenna.

The dipole antenna is formed over the antenna substrate so that a conductive layer with a straight line shape (wider than a coiled antenna) is extended from opposite ends of the radio chip. A microwave method (for example, the UHF band (860 to 960 MHz band), the 2.45 GHz band, or the like) is applied to such a dipole antenna. Note that a region where the dipole antenna is formed may be provided with a linear conductive layer, and an electromagnetic coupling method or an electromagnetic induction method can be applied.

As described above, the radio chip with the antenna is completed.

This application is based on Japanese Patent Application serial No. 2005-341191 filed in Japan Patent Office on Nov. 25, 2005, the entire contents of which are hereby incorporated by reference.

What is claimed is:

1. A semiconductor device comprising:
   an antenna;
   a radio signal input portion comprising a first power potential output terminal and a second power potential output terminal each electrically connected to the antenna; a memory region comprising a first power potential input terminal and a second power potential input terminal electrically connected to, respectively, the first power potential output terminal and the second power potential output terminal, a writing power potential input terminal, and a writing signal input terminal;
   a diode electrically connected in series between the first, power potential output terminal and the writing power potential input terminal;
   a resistor electrically connected between the power potential input terminal and the writing signal input terminal of the memory region so that the writing power potential input terminal, the diode, the resistor, and the writing signal input terminal are connected in series in this order; and
   a logic circuit portion, wherein a reading signal input terminal and a clock signal input terminal of the memory region are electrically connected to corresponding terminals of the logic circuit portion.

2. A semiconductor device comprising:
   an antenna;
   a radio signal input portion comprising:
      a first power potential output terminal,
      a second power potential output terminal, and
      a first clock signal output terminal, each of the output terminals being electrically connected to the antenna;
   a logic circuit portion comprising:
      a reading signal output terminal;
      a first clock signal input terminal, the first clock signal input terminal being electrically connected to the first clock signal output terminal; and
      a second clock signal output terminal;
   a memory region comprising:
      a reading signal input terminal electrically connected to the reading signal output terminal,
      a writing signal input terminal,
      a second clock signal input terminal electrically connected to the second clock signal output terminal,
      a first power potential input terminal electrically connected to the first power potential output terminal,
      a second power potential input terminal electrically connected to the second power potential output terminal, and
      a writing power potential input terminal;
   a diode electrically connected in series between the first power potential output terminal and the writing power potential input terminal; and
   a first resistor electrically connected between the first power potential input terminal and the writing signal input terminal so that the writing power potential input terminal, the diode, the first resistor, and the writing signal input portion are connected in series in this order.

3. A semiconductor device according to claim 1, further comprising an external signal input portion configured to electrically connect the memory region to an external circuit.

4. A semiconductor device according to claim 2, further comprising an external signal input portion configured to electrically connect the memory region to an external circuit.

5. A semiconductor device according to claim 3, wherein the power potential input terminal and the writing signal input terminal of the memory region are electrically connected to corresponding terminals of the external signal input portion.

6. A semiconductor device according to claim 4, wherein the reading signal input terminal, the writing signal input terminal, the second clock signal input terminal, the first power potential input terminal, the second power potential input terminal and the writing power potential input terminal of the memory region are electrically connected to corresponding terminals of the external signal input portion.

7. A semiconductor device according to claim 1, further comprising a second resistor, and third resistor and a logic circuit portion,
   wherein the second resistor is electrically connected between the logic circuit portion and a clock signal input terminal of the memory region; and
   wherein the third resistor is electrically connected between the logic circuit portion and a reading signal input terminal of the memory region.

8. A semiconductor device according to claim 2, further comprising a second resistor and a third resistor,
   wherein the second resistor is electrically connected between the second clock signal output terminal and the second clock signal input terminal; and
   wherein the third resistor is electrically connected between the reading signal output terminal and the reading signal input terminal.

9. A semiconductor device according to claim 1, further comprising a first switch and a logic circuit portion,
   wherein the first switch is electrically connected between the logic circuit portion and a clock signal input terminal of the memory region.

10. A semiconductor device according to claim 2, further comprising a first switch,
    wherein the first switch is electrically connected between the second clock signal output terminal and the second clock signal input terminal.

11. A semiconductor device according to claim 1, further comprising a second switch and a logic circuit portion,
    wherein the second switch is electrically connected between the logic circuit portion and a reading signal input terminal of the memory region.

12. A semiconductor device according to claim 2, further comprising a second switch, wherein the second switch is electrically connected between the reading signal output terminal and the reading signal input terminal of the memory region.

13. A semiconductor device according to claim 3, further comprising a protection circuit electrically connected between the memory region and the external signal input portion.

14. A semiconductor device according to claim 4, further comprising a protection circuit electrically connected between the memory region and the external signal input portion.

15. An operating method of a semiconductor device, the semiconductor device comprising:
   an antenna;
   a radio signal input portion;
   a logic circuit portion electrically connected to the antenna through the radio signal input portion;
   a memory region comprising a first power potential input terminal and a second power potential input terminal electrically connected to, respectively, a first power potential output terminal and a second power potential output terminal of the radio signal input portion and the logic circuit portion;
   a diode electrically connected in series between a writing power potential input terminal and a writing signal input terminal of the memory region;
   a resistor electrically connected between the first power potential input terminal and the writing signal input terminal of the memory region so that the writing power potential input terminal, the diode, the resistor, and the writing signal input terminal are connected in series in this order; and
   an external signal input portion for electrically connecting the memory region to an external circuit, the operating method comprising:
   writing data to the memory region when a first potential of the writing power potential input terminal and a first potential of the first power potential output terminal are such that the diode is in an off state; and
   reading the data from the memory region when a second potential of the writing power potential input terminal is fixed to a second potential of the first power potential output terminal.

* * * * *

UNITED STATES PATENT AND TRADEMARK OFFICE
CERTIFICATE OF CORRECTION

PATENT NO. : 8,983,421 B2  
APPLICATION NO. : 13/024549  
DATED : March 17, 2015  
INVENTOR(S) : Toshihiko Saito et al.

Page 1 of 1

It is certified that error appears in the above-identified patent and that said Letters Patent is hereby corrected as shown below:

In the Specification

At column 2, line 16, "fowl" should be --form--;

In the Claims

In claim 1, at column 23, line 38, "first," should be --first--;

In claim 15, at column 25, lines 22-23, "the radio signal input portion and the logic circuit portion;" should be --the radio signal input portion;--.

Signed and Sealed this  
Sixth Day of October, 2015

Michelle K. Lee  
*Director of the United States Patent and Trademark Office*